United States Patent
Sato

(10) Patent No.: US 10,615,088 B2
(45) Date of Patent: Apr. 7, 2020

(54) SEMICONDUCTOR DEVICE

(71) Applicant: FUJI ELECTRIC CO., LTD., Kanagawa (JP)

(72) Inventor: Tadahiko Sato, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/048,344

(22) Filed: Jul. 30, 2018

(65) Prior Publication Data

US 2019/0080972 A1 Mar. 14, 2019

(30) Foreign Application Priority Data

Sep. 12, 2017 (JP) .................. 2017-174553

(51) Int. Cl.
*H01L 23/48* (2006.01)
*H01L 23/04* (2006.01)
*H01L 23/29* (2006.01)
*H01L 23/367* (2006.01)
*H01L 23/544* (2006.01)
*H01L 23/495* (2006.01)
*H01L 23/24* (2006.01)
*H01L 23/057* (2006.01)

(52) U.S. Cl.
CPC ............ *H01L 23/04* (2013.01); *H01L 23/057* (2013.01); *H01L 23/24* (2013.01); *H01L 23/293* (2013.01); *H01L 23/367* (2013.01); *H01L 23/49537* (2013.01); *H01L 23/49562* (2013.01); *H01L 23/49568* (2013.01); *H01L 23/49575* (2013.01); *H01L 23/544* (2013.01); *H01L 2224/48095* (2013.01); *H01L 2224/48472* (2013.01); *H01L 2224/73265* (2013.01); *H01L 2924/181* (2013.01); *H01L 2924/19107* (2013.01)

(58) Field of Classification Search
CPC ..... H01L 23/04; H01L 23/057; H01L 23/367; H01L 23/49557; H01L 23/49568; H01L 23/544; H01L 2924/181
USPC .................................... 257/666, 696
See application file for complete search history.

(56) References Cited

U.S. PATENT DOCUMENTS

| | | | | |
|---|---|---|---|---|
| 5,585,665 A * | 12/1996 | Anjoh | ................. | H01L 23/4951 257/666 |
| 6,072,231 A * | 6/2000 | Murakami | .......... | H01L 23/3107 257/666 |
| 7,723,838 B2 * | 5/2010 | Takeuchi | .............. | H01L 21/568 257/700 |
| 9,033,248 B2 * | 5/2015 | Suzuki | ............. | G06K 19/07732 235/492 |
| 2009/0026470 A1 * | 1/2009 | Lai | ......................... | H01L 33/44 257/98 |

(Continued)

FOREIGN PATENT DOCUMENTS

| | | |
|---|---|---|
| JP | S58168141 U | 11/1983 |
| JP | H058929 U | 2/1993 |
| JP | 2005011854 A | 1/2005 |

*Primary Examiner* — Nitin Parekh

(57) ABSTRACT

A semiconductor device having a housing is provided, where the housing includes the first surface, concave portions provided to the first surface, the second surface to face toward the first surface, and convex portions provided in contact with the second surface. In a thickness direction of the housing directed from the first surface to the second surface, the concave portions and the convex portions are provided at positions corresponding to each other.

20 Claims, 32 Drawing Sheets

A-A CROSS SECTION

(56) References Cited

U.S. PATENT DOCUMENTS

| | | | |
|---|---|---|---|
| 2009/0096072 A1* | 4/2009 | Balakrishnan | H01L 23/3107 257/670 |
| 2015/0228873 A1* | 8/2015 | Gebuhr | H01L 51/5237 257/99 |
| 2016/0358838 A1* | 12/2016 | Basler | H01L 23/49524 |
| 2016/0365296 A1* | 12/2016 | Otremba | H01L 23/295 |
| 2019/0067154 A1* | 2/2019 | Yoshihara | H01L 23/28 |

* cited by examiner

SEMICONDUCTOR DEVICE

The contents of the following Japanese patent application(s) are incorporated herein by reference:
NO. 2017-174553 filed in JP on Sep. 12, 2017.

BACKGROUND

1. Technical Field

The present invention relates to a semiconductor device.

2. Related Art

Conventionally, a lead terminal arranged on the bottom surface of a package body has been provided with protruding portions (refer to Patent Documents 1 and 2, for example). Also, a surface of a resin case has been provided with a lead fitting groove (refer to Patent Document 3, for example).

PRIOR ART DOCUMENTS

Patent Documents

Patent Document 1: Japanese Patent Application No. 2005-11854.
Patent Document 2: Japanese Unexamined Utility Model Application Publication No. S58-168141.
Patent Document 3: Japanese Unexamined Utility Model Application Publication No. H5-8929.

Generally, identification information about a semiconductor device is imprinted, character printed, or attached on a surface of a housing of the device. Once the surface of the housing is damaged or stained, it may be difficult to identify the identification information.

SUMMARY

In the first aspect of the present invention, a semiconductor device is provided. The semiconductor device may have a housing. The housing may include the first surface, concave portions, the second surface, and convex portions. The first surface may be provided with the concave portions. The second surface may face toward the first surface. The convex portions may be provided in contact with the second surface. In a thickness direction of the housing, the concave portions and convex portions may be provided at positions corresponding to each other. The thickness direction of the housing may be a direction directed from the first surface to the second surface.

The second length of the convex portions may be greater than the first length of concave portions. The second length of the convex portions may be a length from the second surface to ends of the convex portions in the thickness direction. The first length of a concave portion may be a length from the first surface to an end of the concave portion opposite from the first surface in the thickness direction.

The semiconductor device may include a heat dissipation member. The heat dissipation member may be externally exposed on the first surface or the second surface.

The housing may have identification information. At least one of the first surface and the second surface may be provided with the identification information.

The second length of a convex portion may be greater than a length obtained by adding a protruding length of the heat dissipation member and the first length of a concave portion. The second length of the convex portions may be a length from the second surface to ends of the convex portions in the thickness direction. The protruding length of the heat dissipation member may be a protruding length to protrude from the first surface or the second surface. The first length of a concave portion may be a length from the first surface to an end of the concave portion opposite from the first surface in the thickness direction.

The semiconductor device may further include external connection terminals. The external connection terminals may protrude from the second surface. Difference between the second length and the protruding length from the second surface to an end of an external connection terminal opposite from the second surface in the thickness direction may be greater than the first length.

The heat dissipation member may have identification information instead of the first surface or the second surface where the heat dissipation member is externally exposed is provided with the identification information. An end surface of the heat dissipation member, the end surface being externally exposed, may be provided with the identification information.

Outlines of the concave portions may be greater than outlines of the convex portions in the housing as seen in a direction parallel with the thickness direction.

The housing may have two concave portions and two convex portions.

The housing may have three concave portions and three convex portions. The three concave portions may not all need to be provided on a single straight line. The three convex portions may not all need to be provided on a single straight line.

Outer outlines of the first surface and the second surface may be in rectangular shapes in the housing as seen in a direction parallel with the thickness direction. The housing may have four concave portions and four convex portions. Corners of the first surface may be provided with the four concave portions respectively. Corners of the second surface may be provided with the four convex portions respectively.

The concave portions may have shapes different from each other in the first surface as seen in a direction parallel with the thickness direction. The convex portions may have shapes different from each other if the second surface as seen in a direction parallel with the thickness direction. If a plurality of housings is made to overlap each other in the thickness direction, the convex portions may have shapes to fit the concave portions that are provided at corresponding positions in the thickness direction.

The first surface and the second surface may be in rectangular shapes. The housing may have concave portions provided extending along two opposing sides of the first surface respectively and convex portions provided extending along two opposing sides of the second surface respectively.

The housing may have concave portions provided extending along three sides of the first surface respectively and convex portions provided extending along three sides of the second surface respectively.

The housing may have concave portions provided extending along four sides of the first surface respectively and convex portions provided extending along four sides of the second surface respectively.

The housing may have concave portions annularly provided on the first surface, and convex portions annularly provided on the second surface.

The housing may include a frame member and a resin sealing member. The resin sealing member may be provided inside the frame member as the frame member is seen in the thickness direction. A surface of a resin sealing member may constitute a part of the first surface or a part of the second surface. The frame member may be provided with concave portions and convex portions.

The housing may include a frame member and a resin sealing member. The resin sealing member may be provided inside the frame member as the frame member is seen in the thickness direction. The first surface and the second surface may be surfaces of the resin sealing member. The resin sealing member may be provided with concave portions and convex portions.

In the housing, the first surface, the second surface, and side surfaces may be formed of the same resin material respectively. The side surfaces of the housing may be positioned between the first surface and the second surface in the thickness direction. A semiconductor device may include a heat dissipation member. The heat dissipation member may be externally exposed on the first surface or the second surface.

In the second aspect of the present invention, a semiconductor device is provided. The semiconductor device may have a housing and a heat dissipation member. The housing may have the first surface and the second surface, which are surfaces of a resin member respectively. The second surface may face toward the first surface. The heat dissipation member may be externally exposed from the housing on the first surface. If the housing has convex portions provided in contact with the second surface, the heat dissipation member may have concave portions provided to an end surface of the heat dissipation member. Instead of this, if the housing has concave portions provided to the second surface, the heat dissipation member may have convex portions provided in contact with an end surface of the heat dissipation member. Note that, in the thickness direction of the housing directed from the first surface to the second surface, concave portions and convex portions may be provided at positions corresponding to each other.

Note that, the summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described with reference to embodiments of the invention. However, the following embodiments should not to be considered as limiting the claimed invention. Also, every combination of features described with reference to the embodiments should not to be considered essential to means provided by aspects of the invention.

Figure 1:
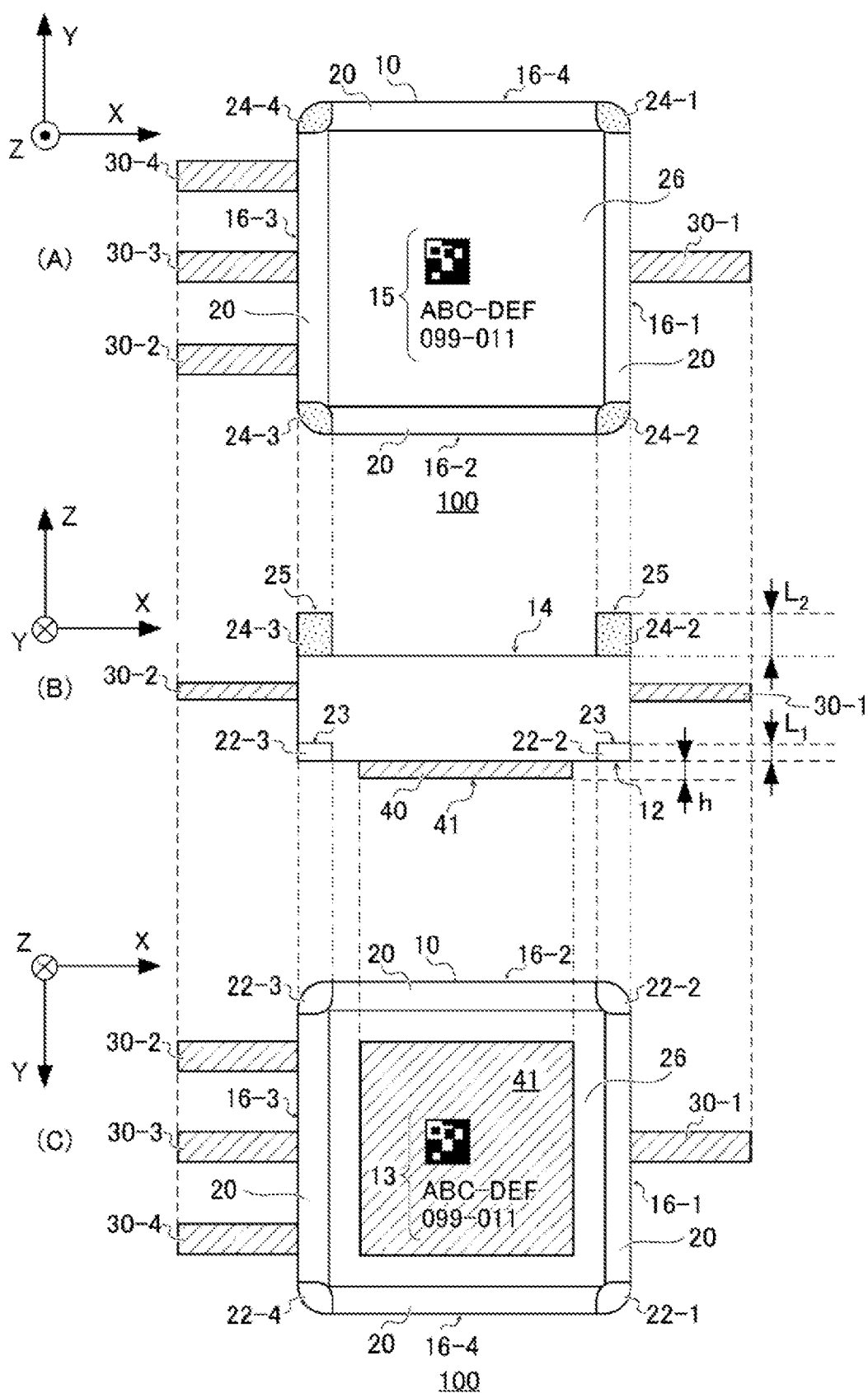
FIG. 1 illustrates a top view (A), a side view (B), and a bottom view (C) of a semiconductor device 100 in the first embodiment.

FIG. 1 illustrates a top view (A), a side view (B), and a bottom view (C) of a semiconductor device 100 in the first embodiment. In the present specification, an X axis direction and a Y axis direction are mutually orthogonal directions, and a Z axis direction is a direction perpendicular to an X-Y plane. The X axis direction, Y axis direction, and Z axis direction form a so-called right-hand system. Note that, in the present specification, a direction parallel with the Z axis direction may be referred to as a thickness direction of a housing 10. In the present specification, a +Z direction and a −Z direction may be referred to as "upward" and "downward", respectively. However, such terms as "upward" and "downward" are not limited to an up-down direction according to the gravitational direction. These terms are merely to indicate relative directions with respect to the Z axis.

The semiconductor device 100 may be a semiconductor package having a semiconductor chip inside a housing 10. The semiconductor device 100 may be used as a semiconductor module in a power inverter circuit, such as a motor driving inverter or a DC/DC converter. The semiconductor device 100 may be an IPM (Intelligent Power Module) having: a power device such as a power MOSFET (Metal Oxide Semiconductor Field Effect Transistor) or an IGBT (Insulated Gate Bipolar Transistor); and a driving circuit and a self-protection function for the power device. Also, the semiconductor device 100 may be a discrete semiconductor chip such as a BJT (Bipolar Junction Transistor), a FET (Field Effect Transistor), or an IGBT.

The semiconductor device 100 of the present example has a housing 10, a plurality of lead frames 30, and a heat dissipation member 40. The housing 10 may be in a cuboid shape. The housing 10 is also referred to as a package body. The housing 10 in the present example includes a frame member 20 and a resin sealing member 26. The entire housing 10 may be formed of resin, and the frame member 20 may also be formed of resin. That is, the material of the housing 10 may be resin. For example, the frame member 20 is formed of
polyphenylenesulfide (PPS) resin or polybutylene terephthalate (PBT) resin. Also, the resin sealing member 26 is formed of epoxy resin, for example. Note that, the frame member 20 and the resin sealing member 26 may be formed of the same resin material.

The housing 10 may have the first surface 12, and the second surface 14 to face toward the first surface 12 in the Z axis direction. In the present example, the first surface 12 and the second surface 14 are surfaces parallel with the X-Y plane. Also, the first surface 12 and the second surface 14 are the lower surface and the upper surface of the housing 10, respectively. More specifically, the first surface 12 of the present example is an end surface of the housing 10 in the −Z direction if assuming that there is no concave portion 22. Also, the second surface 14 of the present example is an end surface of the housing 10 in the +Z direction if assuming that there is no convex portions 24, and is also a surface with which the frame member 20 and the resin sealing member 26 are provided flush.

As shown in (A) and (C) of FIG. 1, outer outlines of the first surface 12 and the second surface 14 are in rectangular shapes in the housing 10 as seen in a direction parallel with the Z axis direction. Although the housing 10 of the present example shown in (A) and (C) is in an approximately square shape, it may be in a rectangular shape in another example. The housing 10 of the present example includes four concave portions 22 respectively provided at corners of the first surface 12, and four convex portions 24 respectively provided at corners of the second surface 14.

In the present example, if a plurality of housings 10 is stacked up in the Z axis direction, the convex portions 24 can fit concave portions 22. Note that, in the present example, any three or more of the concave portions 22 are not provided on a single straight line. Thereby, the plurality of housings 10 can be stably stacked up in the present example, compared to a case in which two pairs or three pairs of a concave portion 22 and a convex portion 24 are provided. Also, in the present example, if a plurality of housings 10 is stacked up in the Z axis direction, it is possible to suppress one housing 10 from being misaligned from its original position by rotating around the Z axis relative to another housing 10 (θ misalignment). Also, the concave portions 22 and the convex portions 24 can be utilized for positioning the semiconductor device 100 in a case in which the semiconductor device 100 is placed on another member, substrate, or the like.

The resin sealing member 26 may be provided inside the frame member 20 as the frame member 20 is seen in the thickness direction of the housing 10. In the present example, the resin sealing member 26 is provided inside the frame member 20 in the housing 10 as seen in a direction directed from the second surface 14 to the first surface 12 as shown in (A) of FIG. 1, and a direction directed from the first surface 12 to the second surface 14 as shown in (C) of FIG. 1.

In the present example, the frame member 20 has the concave portions 22 and the convex portions 24. The first surface 12 may be provided with the concave portions 22. As shown in (B) of FIG. 1, the concave portions 22 in the present example are portions recessed upward from the first surface 12, and provided at a part of the frame member 20. In the present example, a length from the first surface 12 to ends 23 of the concave portions 22 in the +Z direction is defined as the first length $L_1$. In the present example, the ends 23 is an end of a concave portion 22 opposite from the first surface 12 in the thickness direction of the housing 10.

The convex portions 24 may be provided in contact with the second surface 14. The convex portions 24 of the present example are positioned on the second surface 14. Note that, although the convex portions 24 are marked with dotted hatching and the frame member 20 is not marked with hatching in (B) of FIG. 1, the convex portions 24 of the present example constitute a part of the frame member 20. Furthermore, in a different example, the convex portions 24 may be formed of a material different from that of a frame member 20. In the different example, the convex portions 24 may be formed of glass having hardness higher than that of a resin material that composes the frame member 20. In the present example, a length from the second surface 14 to ends 25 of convex portions 24 in the +Z direction is defined as the second length $L_2$. In the present example, the end 25 is an end of a concave portion 22 opposite from the second surface 14 in the thickness direction of the housing 10.

In the present example, a portion of the lower surface of the frame member 20 excluding the concave portions 22 constitutes a part of the first surface 12. Also, a portion of the upper surface of the frame member 20 excluding the convex portions 24 constitutes a part of the second surface 14. Note that, as shown in (B) of FIG. 1, surfaces of the resin sealing member 26 constitute a part of the first surface 12 and the second surface 14.

The heat dissipation member 40 may be externally exposed on the first surface 12 of the housing 10. The heat dissipation member 40 of the present example protrudes from the first surface 12 to the outside. In the present example, a length from the first surface 12 to an end surface 41 of the heat dissipation member 40 positioned outside the housing 10 is defined as a protruding length h of the heat dissipation member 40. Note that, although the protruding length h of the present example has a positive value, a protruding length h may be zero in another example. That is, an end surface 41 of a heat dissipation member 40 may also be flush with the first surface 12. In the present specification, stating that the heat dissipation member 40 is externally exposed on the first surface 12 includes a case in which the protruding length h has a positive value and a case in which it is zero.

As shown in (A) of FIG. 1, the semiconductor device 100 of the present example has a piece of identification information 15 on the second surface 14 of the housing 10. The piece of identification information 15 may be information used to allow individual semiconductor devices 100 to be identified. To enumerate examples, the piece of identification information 15 may be displayed with one-dimensional codes such as alphabetic characters, numbers, and bar codes, or two-dimensional codes such as data matrix and QR™ codes, or a combination thereof. Also, the housing 10 may be provided with the piece of identification information 15 by a means such as: character printing or printing in which the housing 10 is directly provided with ink; selectively cutting a surface of the housing 10 by a laser; providing a surface of the housing 10 with an imprint; selectively burning the housing 10 to leave a burnt color; or attaching a sticker or the like having the piece of identification information 15 on the housing 10.

The piece of identification information 15 may be information optically readable by a piece of equipment. By electrically handling information read out from the piece of identification information 15, it will be possible to track each semiconductor device 100 from its production step to consumption step through a mechanism of IoT (Internet of Things). In the present example, by providing concave portions 22 and convex portions 24 to be described below, the piece of identification information 15 can be appropriately protected. Thereby, traceability of semiconductor devices 100 can be ensured.

As shown in (C) of FIG. 1, the semiconductor device 100 of the present example has a piece of identification information 13 on the end surface 41 of the heat dissipation member 40. The piece of identification information 13 may be displayed by the same displaying method as that of the piece of identification information 15, i.e., displayed with alphabetic characters, numbers, codes, and the like, and may be provided by the same means as that of the piece of identification information 15. Of course, the piece of identification information 13 may also be utilized for the traceability. In the present example also, by providing concave portions 22 and convex portions 24 to be described below, the piece of identification information 13 can be appropriately protected. Hence, in both of the second surface 14 and the end surface 41, traceability of the semiconductor device 100 can be ensured.

Concave portions 22 and convex portions 24 may be provided at positions corresponding to each other in the thickness direction of the housing 10. Also, if the first surface 12 of the first housing 10 and the second surface 14 of the second housing are made to overlap each other, convex portions 24 may fit concave portions 22. In the present example, the second length $L_2$ is greater than the length obtained by adding the length h to the first length $L_1$ (h+$L_1$), (i.e., h+$L_1$<$L_2$). Thereby, if a plurality of semiconductor devices 100 is stacked up in the Z axis direction, it is possible to prevent an end surface 41 of a heat dissipation member 40 of the first semiconductor device 100 and the second surface 14 of the second semiconductor device 100 from contacting each other. That is, it is possible to stack up a plurality of housings 10 in the Z axis direction while keeping clearance between the second surface 14 of a housing 10 and an end surface 41 of a heat dissipation member 40 adjacent to each other in the Z axis direction.

In the present example, since it is possible to prevent an end surface 41 of a heat dissipation member 40 and the second surface 14 of a housing 10 from contacting each other, both pieces of identification information 13 and 15 can be prevented from being damaged or stained. Hence, a situation where identification information becomes difficult to be identified can be avoided. In addition, appearance defects of semiconductor devices 100 can be reduced.

In the present example, particularly in a case in which a plurality of semiconductor devices 100 is transported all together, it is possible to prevent both pieces of identification information 13 and 15 from being damaged or stained even if housings 10 are stacked up. Conventionally, as a result of identification information becoming difficult to be identified, semiconductor devices 100 may have been discarded even if the semiconductor devices 100 had no problems in their performance. However, in the present example, by preventing identification information from being damaged or stained, it is possible to avoid a situation where semiconductor devices 100 having no problems in their performance are discarded.

Note that, if a plurality of semiconductor devices 100 is stacked up in a predetermined range of length in the Z axis direction, the smaller the clearance ($L_2$-$L_1$-h), the more semiconductor devices 100 can be stacked up (provided $L_2$-$L_1$-h is greater than zero). Thereby, it is possible to improve transportation efficiency of a plurality of semiconductor devices 100. The clearance ($L_2$-$L_1$-h) may be greater than zero and equal to or less than the thickness of a housing 10 in the Z axis direction. In one example, thickness, the first length $L_1$, the second length $L_2$, and a protruding length h of a housing 10 are 5 mm, 0.5 mm, 1 mm, and 0.1 mm in the Z axis direction, respectively.

Each of the plurality of lead frames 30 may protrude from a side surface 16 of a housing 10 to the outside. In the present example, among four side surfaces 16 of the housing 10, one lead frame 30-1 protrudes in the +X direction from a side surface 16-1 positioned at the end in the +X direction, and three lead frames 30-2, 30-3, and 30-4 protrude in the −X direction from another side surface 16-3 positioned at the end in the −X direction. Note that, the number of the lead frames 30 is not limited to four. Furthermore, in another example, lead frames 30 may protrude from the first surface 12 or the second surface 14.

Figure 2:
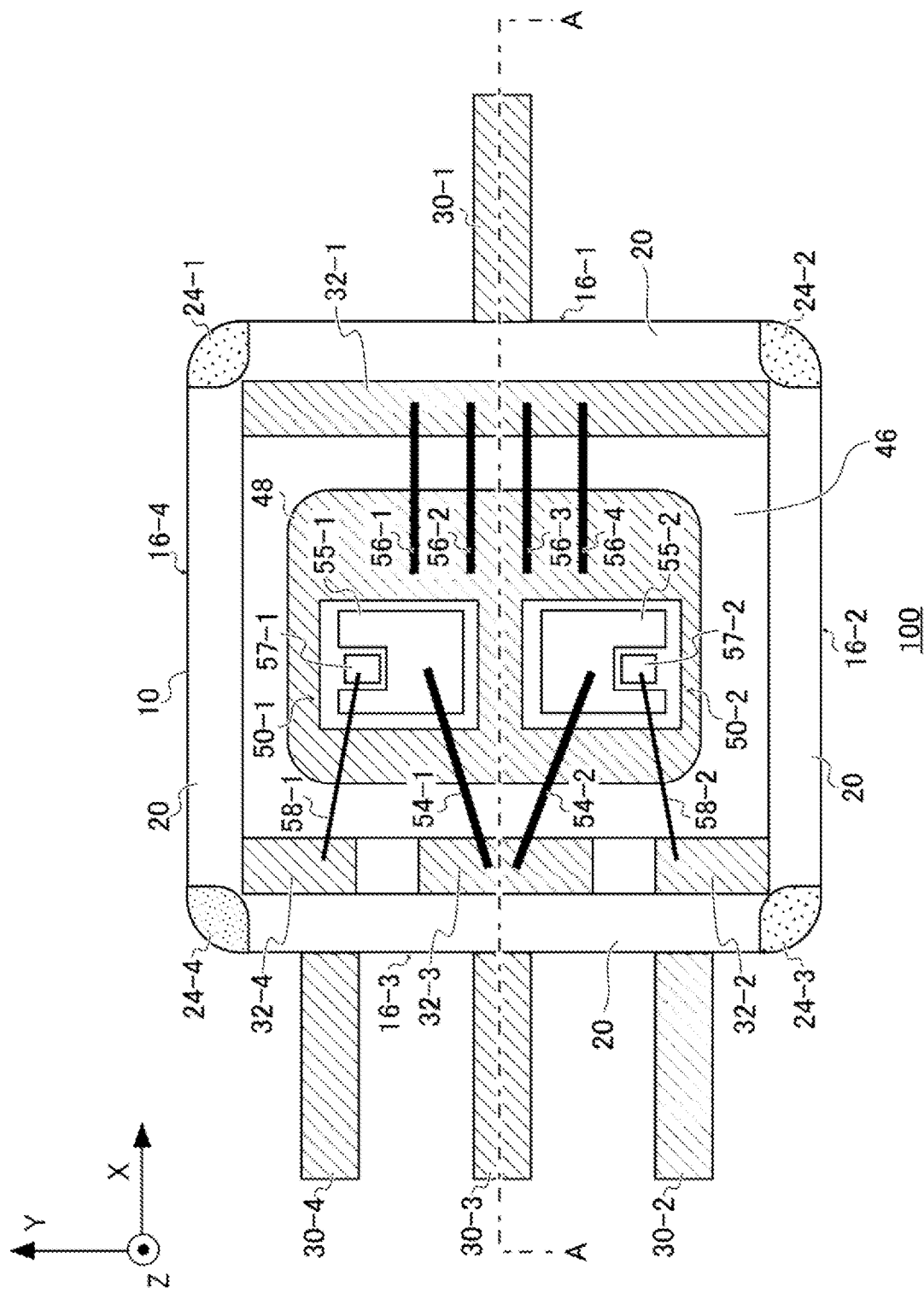
FIG. 2 illustrates (A) of FIG. 1 in which a resin sealing member 26 is taken off.

FIG. 2 illustrates (A) of FIG. 1 with a resin sealing member 26 taken off. The semiconductor device 100 may have semiconductor chips 50, wires 54, 56, and 58, a metal pattern layer 48, and an insulating layer 46 inside a frame member 20. The semiconductor device 100 of the present example has two semiconductor chips 50-1 and 50-2. The semiconductor chips 50 are a RC-IGBT (Reverse Conducting-IGBT) semiconductor chips, for example.

The lead frame 30-1 may be a collector connecting component in the semiconductor device 100. The lead frame 30-1 may be electrically connected to collector electrodes of the semiconductor chips 50. The lead frame 30-1 of the present example is electrically connected to wires 56-1 to 56-4 in a region 32-1. The region 32-1 constitutes a part of the lead frame 30-1 and is a region positioned inside the frame member 20. Wires 56-1 to 56-4 electrically connect the region 32-1 and the metal pattern layer 48.

The metal pattern layer 48 is provided with the semiconductor chips 50 thereon. The semiconductor chips 50 may have the collector electrodes on the lower surface side. The collector electrodes may be electrically connected to the metal pattern layer 48 via solder layers or the like. Also, the insulating layer 46 positioned on the heat dissipation member 40 may be provided with the metal pattern layer 48 thereon. The insulating layer 46 may ensure electrical insulation between the metal pattern layer 48 and the heat dissipation member 40.

The semiconductor chips 50 may have emitter electrodes 55 and gate metal layers 57 on the upper surface side. An emitter electrode 55-1 and an emitter electrode 55-2 may be electrically connected to a region 32-3 of the lead frame 30-3 via a wire 54-1 and a wire 54-2, respectively. The lead frame 30-3 may be an emitter connecting component in the semiconductor device 100. The region 32-3 of the present example constitutes a part of the lead frame 30-3 and is a region positioned inside the frame member 20.

A gate metal layer 57-1 may be electrically connected to a region 32-4 of the lead frame 30-4 via a wire 58-1. The lead frame 30-4 may be a gate connecting component in the semiconductor device 100. The region 32-4 of the present example constitutes a part of the lead frame 30-4 and is a region positioned inside the frame member 20. A lead frame 30-2 may also be a gate connecting component in the semiconductor device 100. For example, the semiconductor chips 50-1 and 50-2 are turned on or off by the lead frames 30-4 and 30-2. A gate metal layer 57-2 may be electrically connected to a region 32-2 that constitutes a part of the lead frame 30-2 and is a region positioned inside the frame member 20 via a wire 58-2.

Figure 3:
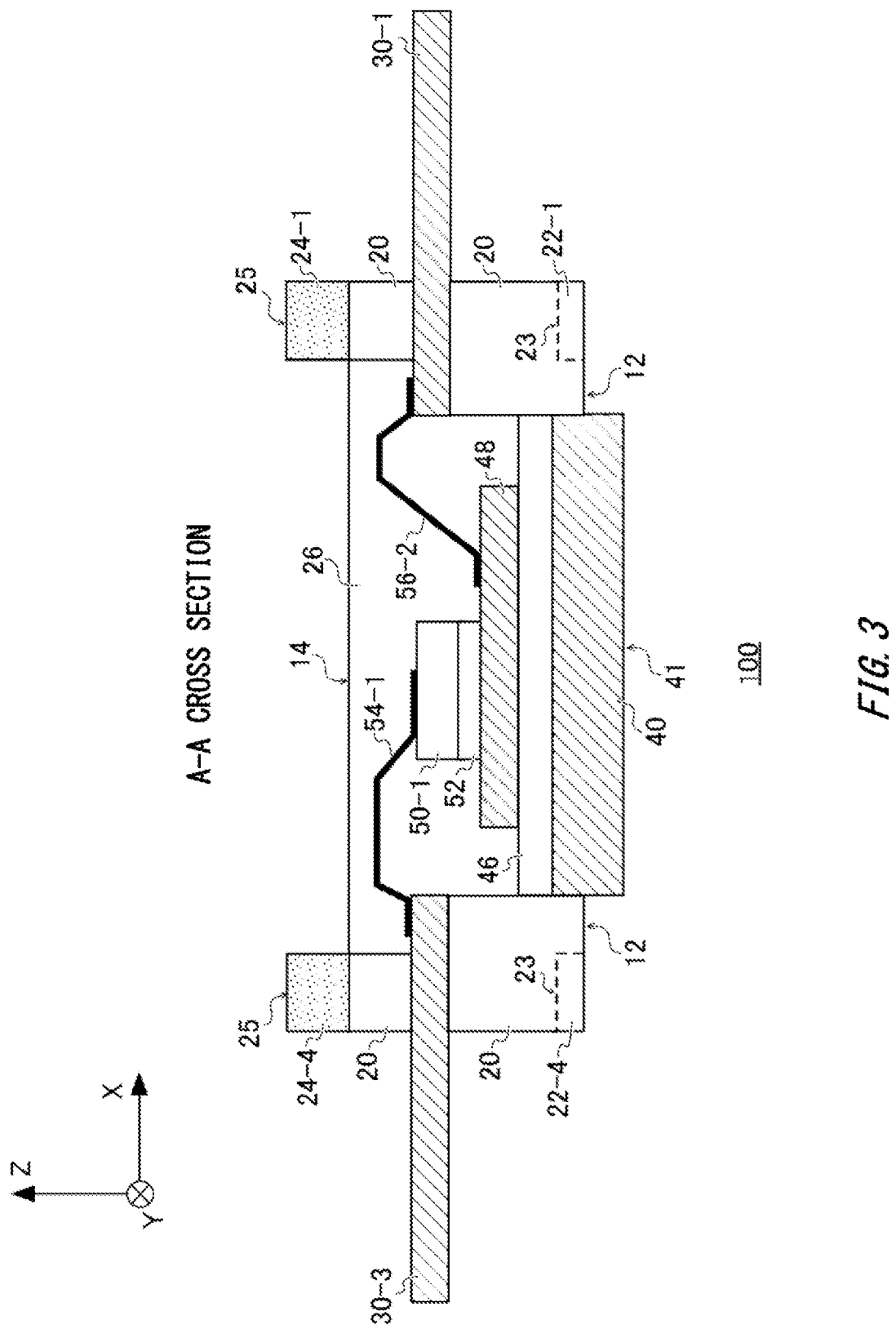
FIG. 3 illustrates a cross section taken along A-A in FIG. 2.

FIG. 3 illustrates a cross section taken along A-A in FIG. 2. The A-A cross section is parallel to the X-Z plane and passes through the lead frames 30-1 and 30-3. The semiconductor chips 50 of the present example are placed above a stack of the heat dissipation member 40, the insulating layer 46, and the metal pattern layer 48 via solder layers 52. The material for the metal pattern layer 48 may be copper (Cu). The insulating layer 46 may be a resin insulating layer blended with filler that is formed of a material having high heat dissipation such as BN (boron nitride). The material for the heat dissipation member 40 may be aluminum (Al) or copper (Cu).

The heat dissipation member 40 of the present example has a function of releasing heat of the semiconductor chips 50 to the outside of the semiconductor device 100. The heat dissipation member 40 may be arranged on a cooler in which coolant flows. By cooling heat of the semiconductor chips 50, it is possible to prevent increase in loss caused by increase in resistance components, and thermal runaway destruction in advance, which are due to temperature rise of the semiconductor device 100. Note that, in another example, a DCB (Direct Copper Bond) substrate having a ceramics insulating layer whose surfaces are directly sandwiched by copper, may be used instead of an insulating layer 46 and a metal pattern layer 48. Also, in case of using a DCB substrate, a heat dissipation member 40 may be provided with the DCB substrate thereon, or the heat dissipation member 40 may be omitted and a cooler may be provided with the DCB substrate thereon.

In yet another example, a lead frame 30 may be extended to reach the lower portion of a semiconductor chip 50, instead of providing a semiconductor device 100 with an insulating layer 46. Thereby, a lead frame 30 can serve as a metal pattern layer 48 and a heat dissipation member 40. That is, the semiconductor chip 50 may be mounted on one surface of an extended lead frame 30, and the surface opposite from the one surface on which the semiconductor chip 50 is mounted may be made as a heat dissipation surface corresponding to the end surface 41 of the heat dissipation member 40 mentioned above.

A manufacturing method of the semiconductor device 100 is simply explained as follows. First, the frame member 20 is formed. Next, the lead frames 30 are attached to the frame member 20. Note that, the frame member 20 and the lead frames 30 may be integrally formed in advance. Next, the stack of the heat dissipation member 40, insulating layer 46, and metal pattern layer 48 is fit into the frame member 20. Next, the semiconductor chips 50 are bonded to the metal pattern layer 48 via solder layers 52. Next, the semiconductor chips 50 and lead frames 30 are connected by the wires 54, 56, and 58. Finally, the resin sealing member 26 is poured into the frame member 20. Note that, in another example, a housing 10 may be formed by transfer molding instead of a frame member 20 and a resin sealing member 26.

The concave portions 22 may correspond to inlets (i.e. gate portions) for injecting a resin material into a mold, which is used when the frame member 20 is in molding process. Also, the convex portions 24 or concave portions 22 may function as ejector portions for pushing out the frame member 20 from the mold after pouring the resin material into the mold. For example, ejector pins provided in the mold push out the convex portions 24 or concave portions 22 from the mold to the outside. Thereby, the frame member 20 may be taken out from the mold. The present example is advantageous in that the mold may not need to be provided with additional concave portions and convex portions in addition to the gate portions and ejector portions.

Figure 4:
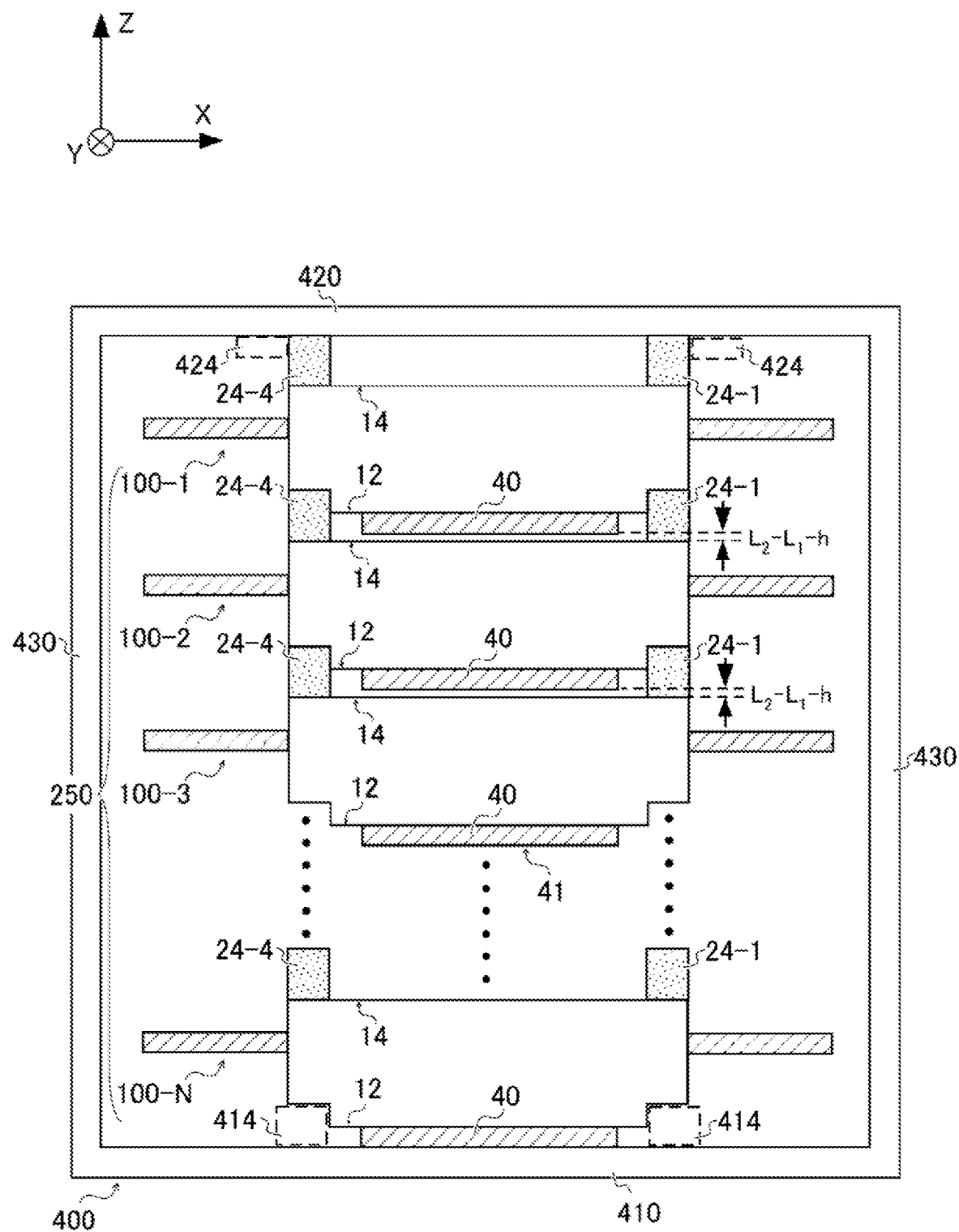
FIG. 4 illustrates a transporting box 400 encasing a stack 250 in which a plurality of semiconductor devices 100 is stacked up in the Z direction.

FIG. 4 illustrates a transporting box 400 encasing a stack 250 in which a plurality of semiconductor devices 100 is stacked up in the Z direction. Clearance between an end surface 41 of a heat dissipation member 40 and the second surface 14 of a housing 10 adjacent to each other in the Z direction is $L_2-L_1-h$. Convex portions of a semiconductor device 100 positioned at an end in the +Z direction may contact with the upper plate 420 of the transporting box 400. Also, an end surface 41 of a semiconductor device 100 positioned at an end in the -Z direction may contact with the lower plate 410 of the transporting box 400. The material of the transporting box 400 may be cardboard used as materials of cardboard boxes, plastic such as polypropylene, or metal such as stainless steel.

The transporting box 400 may fix the stack 250 so that the stack 250 does not move inside the transporting box 400. For example, the stack 250 is fixed in the Z axis direction by applying pressure on the upper plate 420 in the -Z direction and by applying pressure on the lower plate 410 in the +Z direction. For example, pressurization on the lower plate 410 and upper plate 420 is realized by fixing the lower plate 410 and upper plate 420 with side plates 430. Note that, the pressurization may also be realized by placing a fixing member such that the lower plate 410, the upper plate 420, and side plates 430 are enclosed by the fixing member.

Also, the stack 250 may also be fixed in the Y axis direction by making a side surface 16 of a housing 10 and a side plate of the transporting box 400 that are facing each other contact each other in the Y axis direction. In addition to this, the stack 250 may be ensured not to move in the X-Y plane direction by providing the lower plate 410 with convex portions 414 to contact with concave portions 22, and by providing the upper plate 420 with a convex portion 424 to contact with a convex portion 24 in at least one of the X and Y directions. Convex portions 414 and convex portions 424 may be provided corresponding to the number of concave portions 22 and convex portions 24 of a housing 10.

Figure 5:
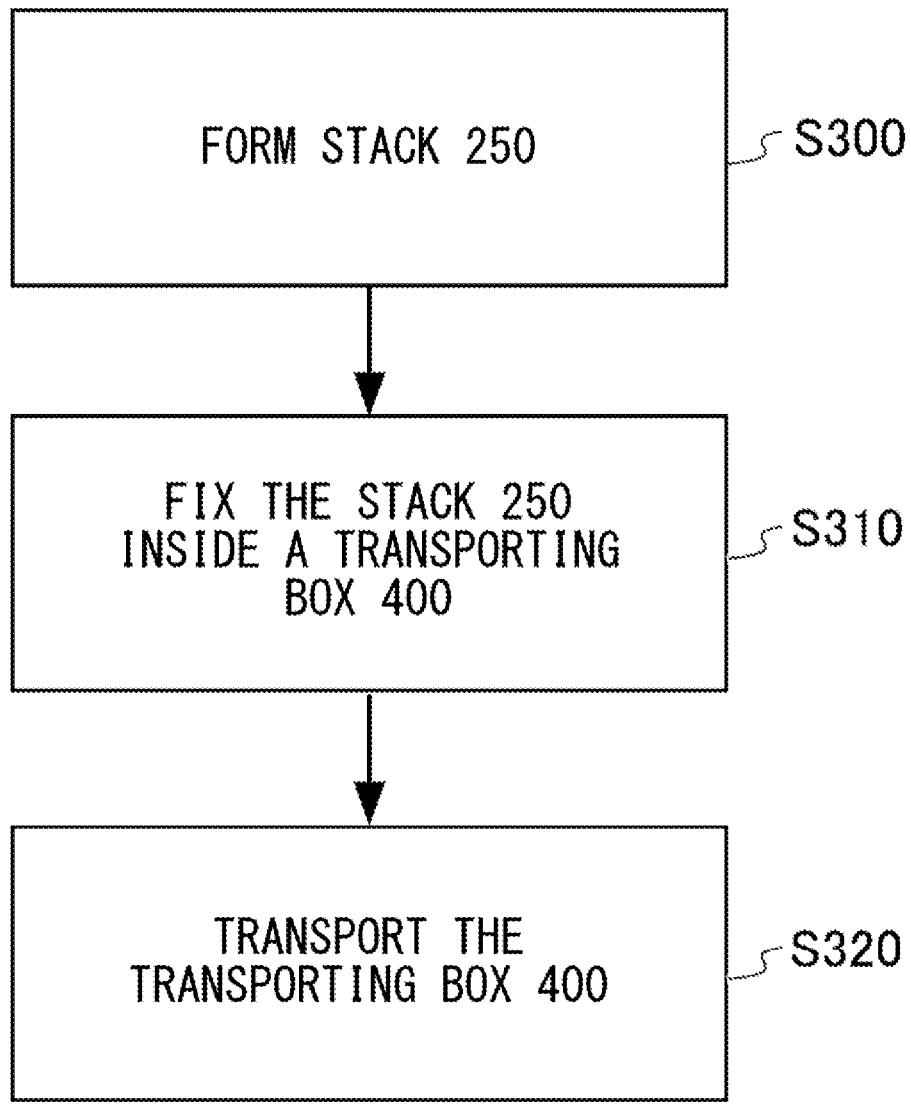
FIG. 5 illustrates a transportation method of the stack 250 of the semiconductor devices 100.

FIG. 5 illustrates a transportation method of a stack 250 of semiconductor devices 100. The transportation method of the present example includes: Step S300 for forming the stack 250; Step S310 for fixing the stack 250 inside a transporting box 400; and Step S320 for transporting the transporting box 400. In Step S300, a plurality of semiconductor devices 100 may be stacked up in the Z axis direction as described above. In Step S310, the stack 250 may be fixed inside a transporting box 400 as described above. In Step S320, the transporting box 400 may be transported by conveyor belt, vehicle, ship or airplane, or the transporting box 400 may also be transported, held by a person.

Figure 6:
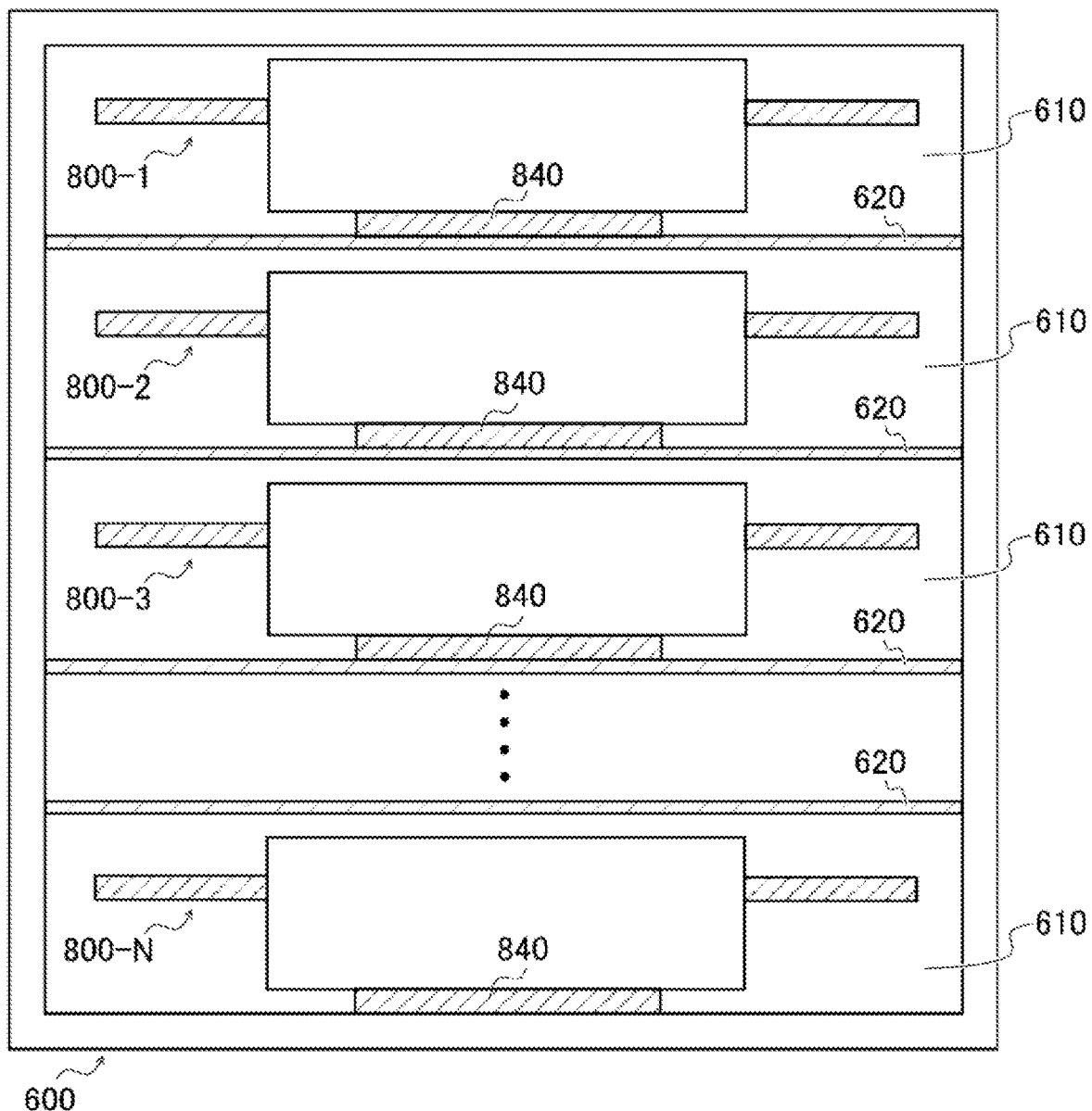
FIG. 6 illustrates a comparative example in which one semiconductor device 800 is encased in each space 610 of a rack 600.

FIG. 6 illustrates a comparative example in which one semiconductor device 800 is encased in each space 610 of a rack 600. The rack 600 is a rack dedicated for transporting the plurality of semiconductor devices 800. By providing the inside of the rack 600 with a plurality of division plates 620, the inside of the rack 600 is divided into a plurality of spaces 610. The semiconductor devices 800 are semiconductor devices in the comparative example, which do not have concave portions 22 or convex portions 24. Each semiconductor device 800 according to the comparative example also has a piece of identification information on the upper surface of its housing or on the lower surface of its heat dissipation member 840. In the comparative example, because the lower surface and upper surface are scratched due to a semiconductor device 800 moving in a space 610, there is a chance of a piece of identification information provided to the lower surface or upper surface being damaged or stained. Besides, there is a chance of all of the semiconductor devices 800 being damaged or stained.

In contrast, in the first embodiment (mentioned above with reference to FIG. 4), a plurality of semiconductor devices 100 that are stacked up can be transported in a general box instead of the dedicated rack 600. Hence, cost needed for transportation can be reduced compared to the comparative example of FIG. 6. In addition, in the example of FIG. 4 mentioned above, it is possible to significantly reduce a chance of identification information being damaged or stained compared to the comparative example of FIG. 6.

Figure 7:
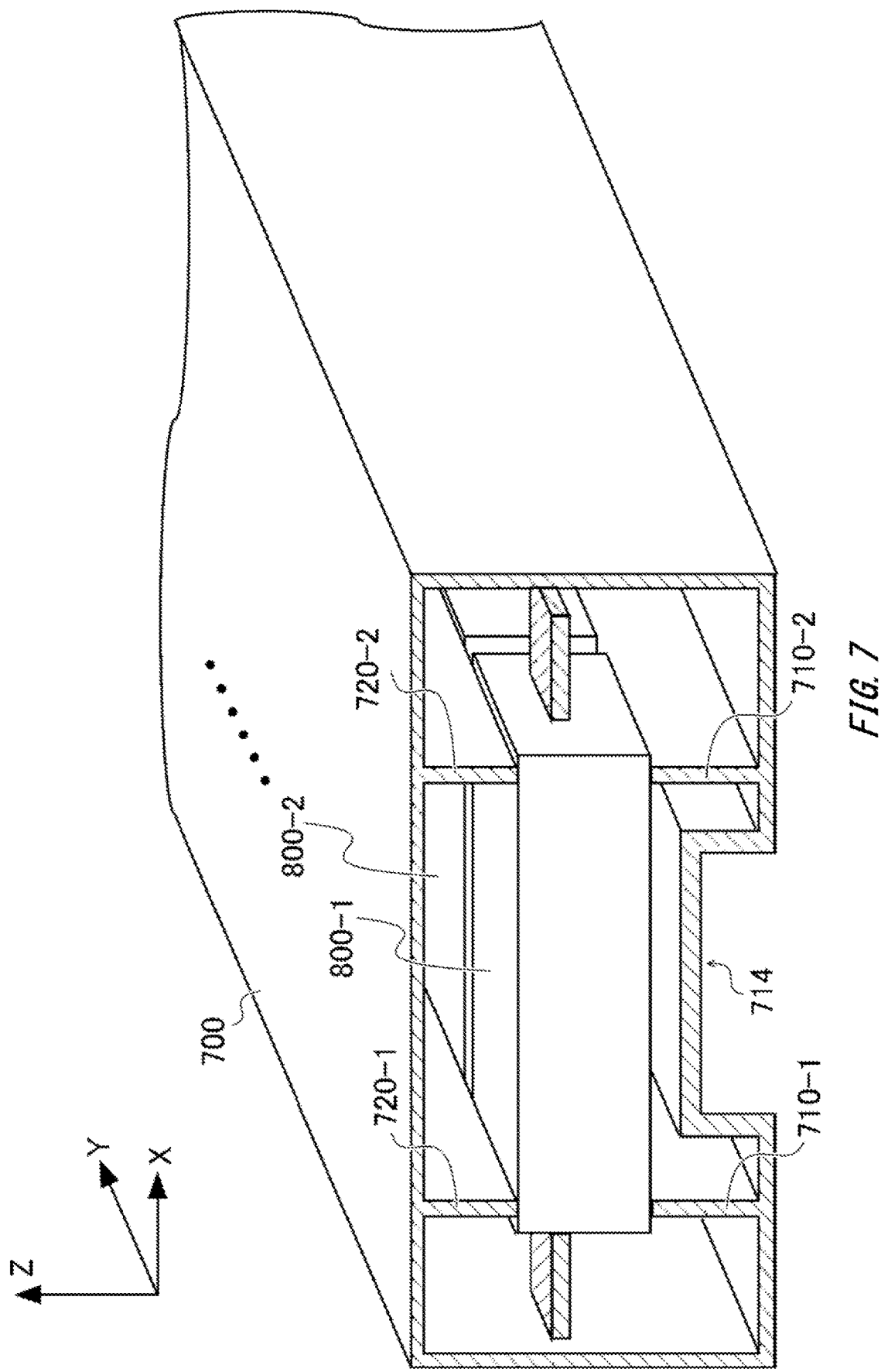
FIG. 7 illustrates a comparative example in which a plurality of semiconductor devices 800 is encased in a stick type case 700.

FIG. 7 illustrates a comparative example in which a plurality of semiconductor devices 800 is encased in a stick type case 700. The case 700 is a case dedicated for transporting the plurality of semiconductor devices 800. The case 700 is longer in length in the Y axis direction than a length in the X or Z axis directions. The case 700 has linear protruding portions 710-1 and 710-2 to support the lower portions of the semiconductor devices 800 and linear protruding portions 720-1 and 720-2 to press down the upper portions of the semiconductor devices 800. Also, the case 700 has a linear wide-width protruding portion 714 with a protruding length smaller than the linear protruding portions 710, which is provided between the linear protruding portions 710-1 and 710-2. The plurality of semiconductor devices 800 is encased, arranged in one line in the Y axis direction inside the case 700.

In contrast, in the first embodiment in which semiconductor devices 100 are stacked up (mentioned above with reference to FIG. 4), the plurality of semiconductor devices 100 can be transported in a general box instead of the dedicated case 700. Hence, cost needed for transportation can be reduced compared to the comparative example of FIG. 7. In addition, in the comparative example of FIG. 7, there is a chance of identification information being damaged or stained due to the linear protruding portions 710 and 720 scratching surfaces of the semiconductor devices 800. However, in the example of FIG. 4 mentioned above, it is possible to significantly reduce a chance of identification information being damaged or stained.

Figure 8:
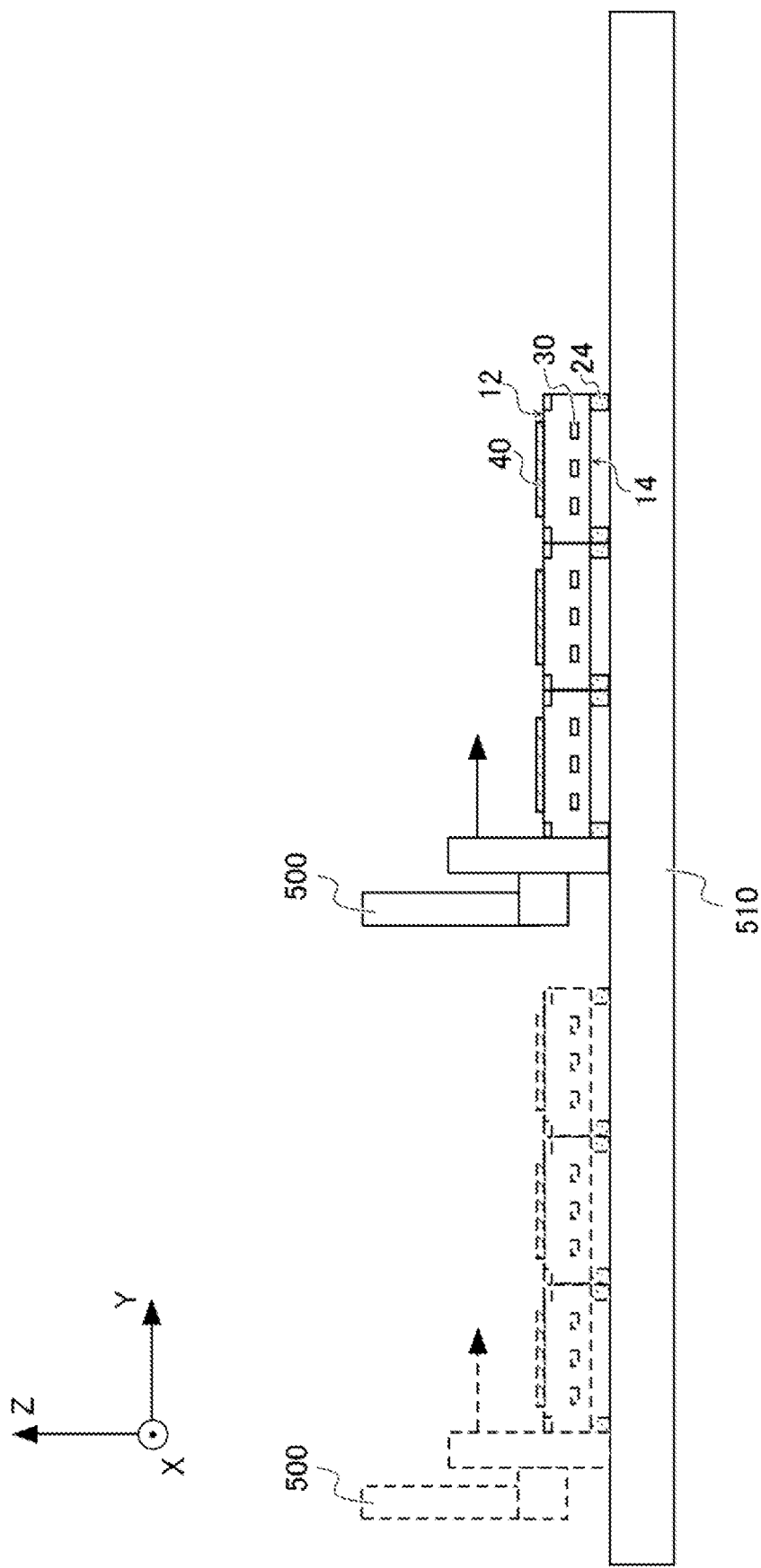
FIG. 8 illustrates a state of the present embodiment in which a robot arm 500 is used to move semiconductor devices 100 on a passage 510.

FIG. 8 illustrates a state of the present embodiment in which a robot arm 500 is used to move semiconductor devices 100 on a passage 510. The semiconductor devices 100 of the present example may be put on the passage 510 such that convex portions 24 are in contact with the passage 510. The robot arm 500 may move a plurality of the semiconductor devices 100 in the +Y direction by collectively pushing out one or more semiconductor devices 100 in the +Y direction. The robot arm 500 may sequentially move each group including a plurality of semiconductor devices 100 in the +Y direction. In the present example also, because second surfaces 14 are not in direct contact with the passage 510, it is possible to prevent pieces of identification information 15 provided to the second surfaces 14 from being damaged or stained. In this way, convex portions 24 are also advantageous in a case in which semiconductor devices 100 are individually transported.

Figure 9:
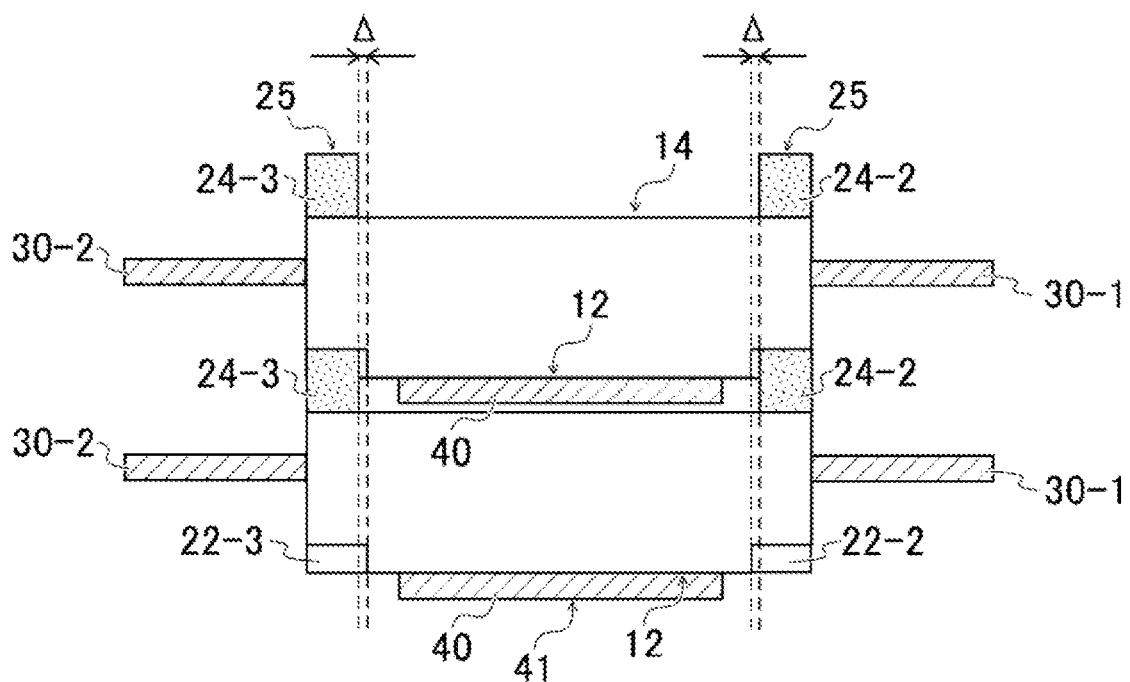
FIG. 9 is a drawing to explain outlines of concave portions 22 and outlines of convex portions 24.

FIG. 9 is a drawing to explain outlines of concave portions 22 and outlines of convex portions 24. Outlines of concave portions 22 may be greater than outlines of convex portions 24 in a housing 10 as seen in the Z axis direction. For example, in a state of aligning in the X axis direction positions of side surfaces 16 of two housings 10 that are stacked up in the Z axis direction, lengths of concave portions 22 in the X axis direction is greater than lengths of convex portions 24 in the X axis direction by Δ. Also, similarly in a state of aligning positions in the Y axis direction, lengths of the concave portions 22 in the Y axis direction may be greater than lengths of the convex portions 24 in the Y axis direction by Δ. By providing at least one of the X and Y axis directions with the play 4, fitting of the concave portions 22 and convex portions 24 is facilitated. Thereby, it is possible to shorten work time in stacking up a plurality of semiconductor devices 100.

Figure 10:
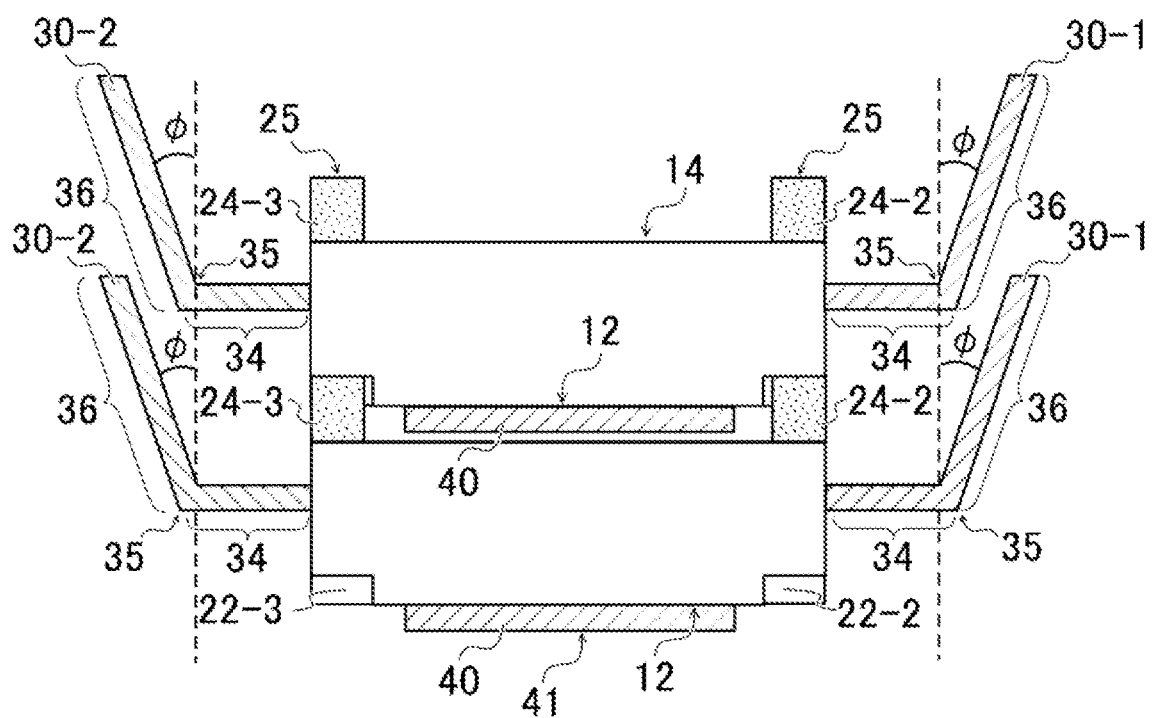
FIG. 10 illustrates another example of lead frames 30.

FIG. 10 illustrates another example of lead frames 30. The lead frames 30 of the present example have first regions 34, second regions 36, and bends 35. In the present example, the first regions 34 protrude parallel with the X axis direction from side surfaces 16 of a housing 10. Also, the second regions 36 protrude in the Z axis direction in a form inclined with respect to the Z axis direction by a predetermined angle φ, from an end of a first region 34 opposite from the side surface 16 of the housing 10. The bends 35 are positioned at connecting portions between the first regions 34 and second regions 36.

In the present example, a straight line parallel with the Z axis direction and the second region 36 form the angle φ. If a plurality of semiconductor devices 100 is stacked up, the angle φ may be an angle to allow the second regions 36 of lead frames 30, which are adjacent to each other in the Z axis direction, not to contact (not interfere with) each other. The angle φ may be an acute angle. The angle φ is greater than 0 degrees and smaller than 90 degrees, for example. By taking the thickness of lead frames 30 into account, the angle φ may be 7 degrees or more to prevent lead frames 30 from contacting each other.

Figure 11:
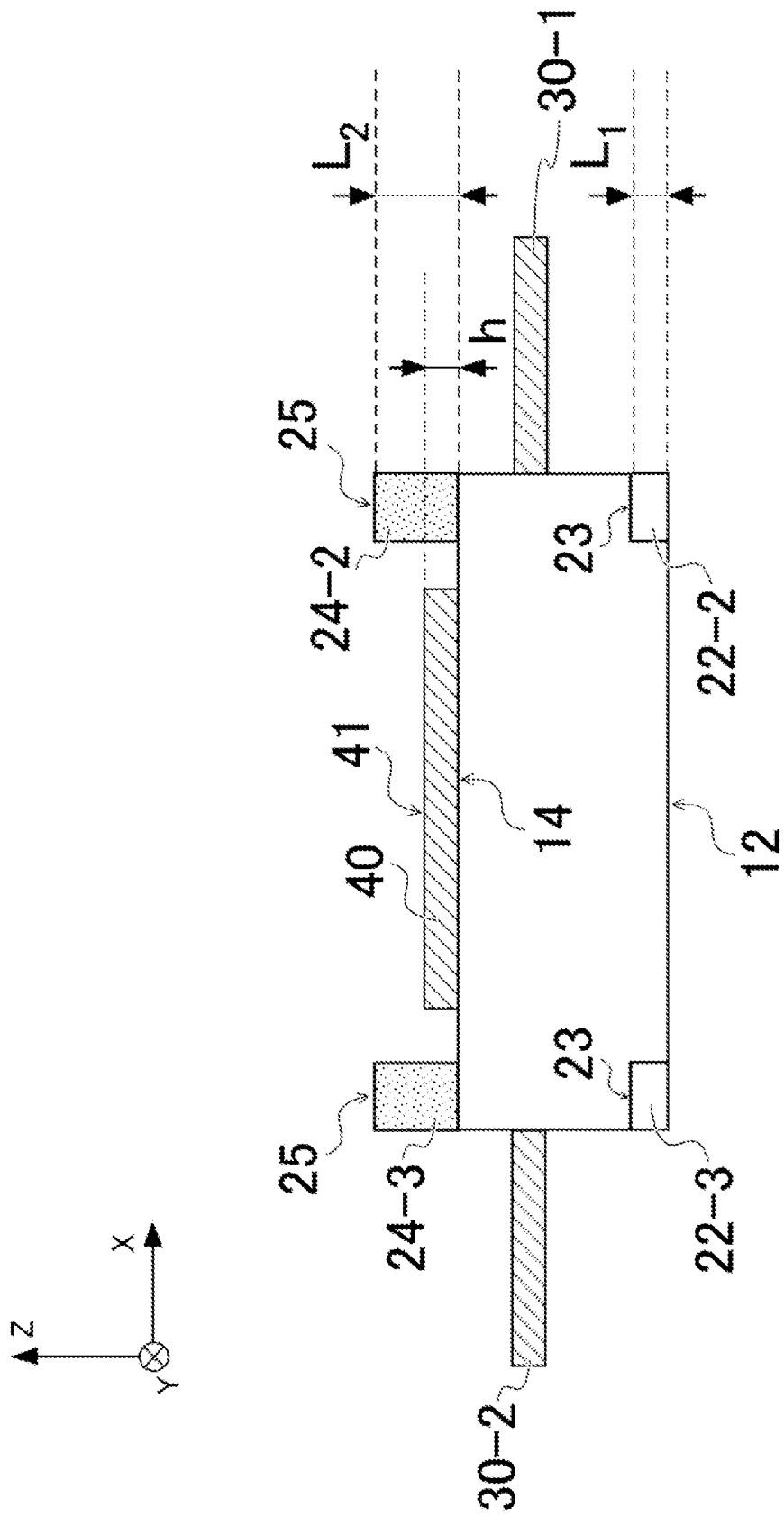
FIG. 11 illustrates an example in which a heat dissipation member 40 is externally exposed on the second surface 14.

FIG. 11 illustrates an example in which a heat dissipation member 40 is externally exposed on the second surface 14. In the present example, a length from the second surface 14 to an end surface 41 of the heat dissipation member 40 positioned outside of a housing 10 is defined as a protruding length h of the heat dissipation member 40. Note that, although the protruding length h of the present example has a positive value, a protruding length h may be zero in another example. That is, an end surface 41 of a heat dissipation member 40 may be flush with the second surface 14. In the present example also, clearance ($L_2$–$L_1$–h) may have a positive value.

In the present example, the first surface 12 13 is provided with a piece of identification information and the end surface 41 is provided with a piece of identification information 15. In the present example also, if a plurality of semiconductor devices 100 is stacked up in the Z axis direction, it is possible to prevent both or one of the piece of identification information 13 on the first surface 12 and the piece of identification information 15 on the end surface 41 from being damaged or stained. Also, just like the example of FIG. 8, if a semiconductor device 100 is put on a passage 510 such that convex portions 24 are in contact with the passage 510, it is possible to prevent a piece of identification information 15 provided to the second surface 14 from being damaged or stained.

Figure 12:
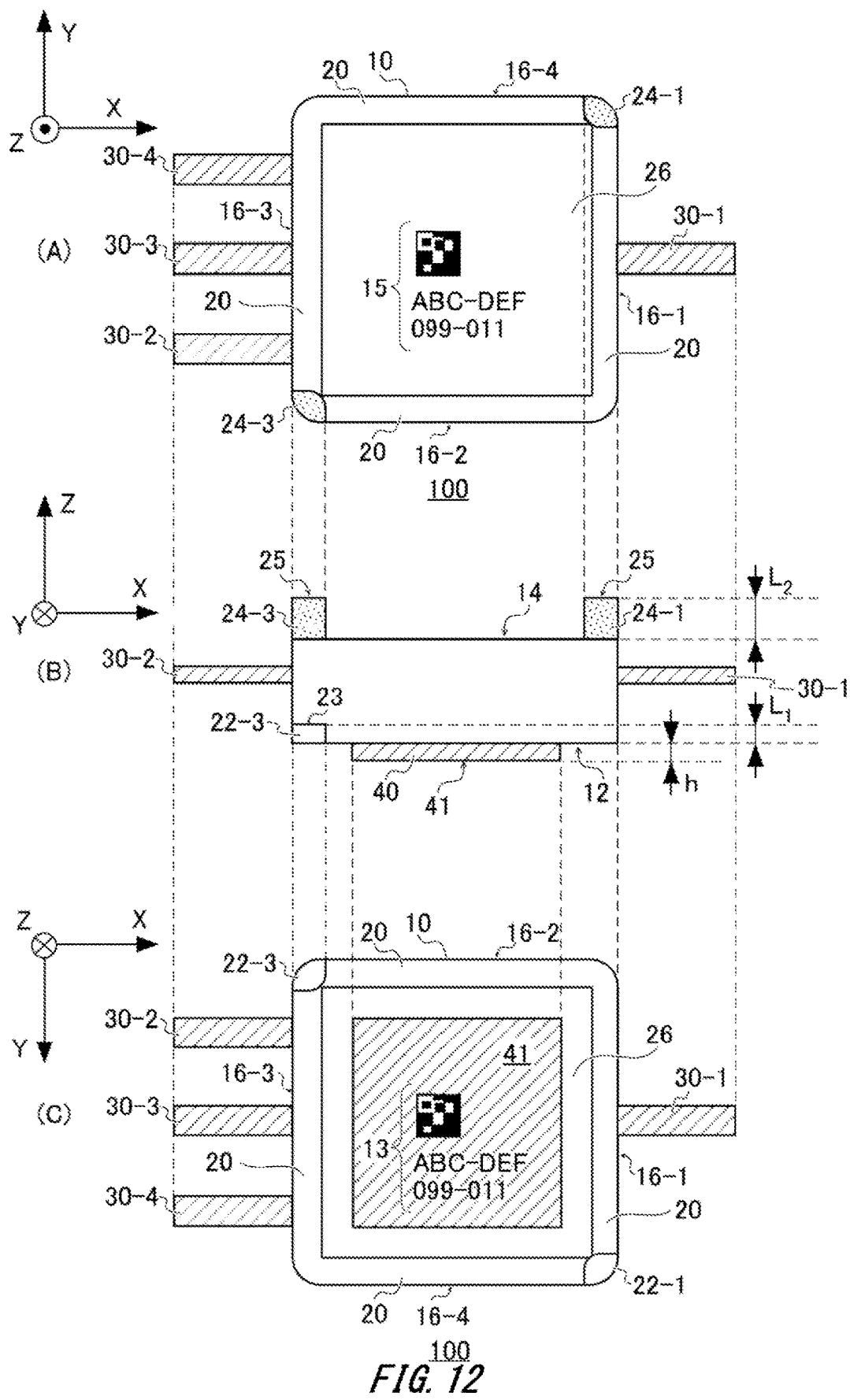
FIG. 12 illustrates the first modification examples of concave portions 22 and convex portions 24.

FIG. 12 illustrates the first modification examples of concave portions 22 and convex portions 24. (A) to (C) illustrate a top view, a side view, and a bottom view respectively, of a semiconductor device 100 in the first modification example. A housing 10 may have two or more concave portions 22, and two or more convex portions 24 corresponding to the concave portions 22 in the Z axis direction. Note that, the number of concave portions 22 and convex portions 24 may mean the number of concave portions 22 and convex portions 24 independent of each other. For example, two concave portions 22 means two concave portions 22 spaced apart from each other. Also, two convex portions 24 may mean two convex portions 24 spaced apart from each other.

A housing 10 of the present example has two concave portions 22-1 and 22-3 provided to a diagonal line in the X-Y plane and two convex portions 24-1 and 24-3 provided to a diagonal line in the X-Y plane. In the present example also, it is possible to receive advantageous effect mentioned above, which is derived from the concave portions 22 and the convex portions 24.

However, in another example, a pair of concave portions 22 and a pair of convex portions 24 may be provided to diagonal lines different from those of the present example. Yet in another example, a pair of convex portions 24 may be provided point-symmetrically with respect to the center of the second surface 14 of a rectangular shape. In this case, the pair of convex portions 24 may be provided such that they are in contact with a side of the second surface 14. Also, a pair of concave portions 22 may be provided at positions corresponding to convex portions 24 in the Z axis direction.

Figure 13:
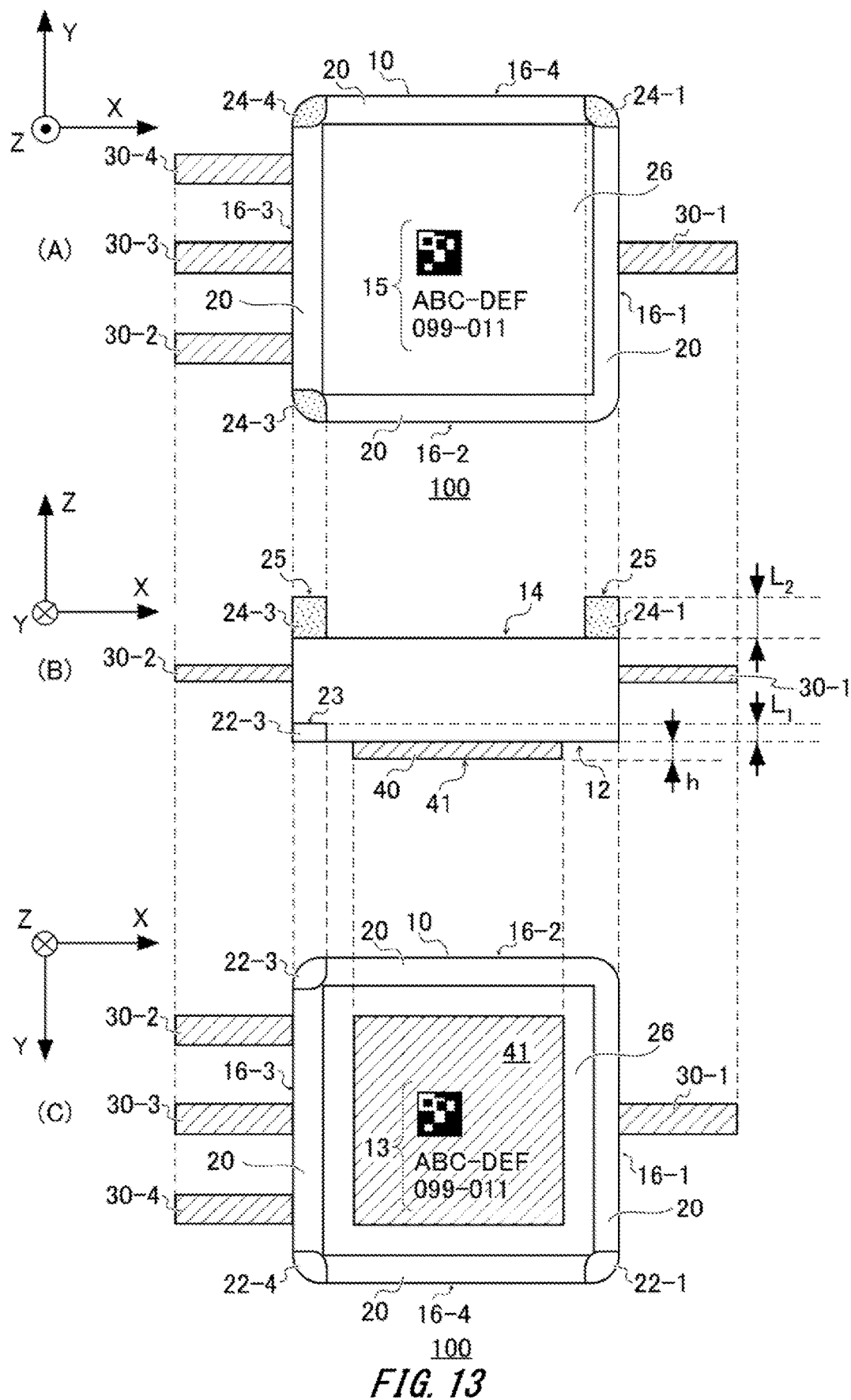
FIG. 13 illustrates the second modification examples of concave portions 22 and convex portions 24.

FIG. 13 illustrates the second modification examples of concave portions 22 and convex portions 24. (A) to (C) illustrate a top view, a side view, and a bottom view respectively, of a semiconductor device 100 in the second modification example. A housing 10 may include three concave portions 22 not all of which are provided on a single straight line and three convex portions 24 not all of which are on a single straight line. The housing 10 of the present example has three concave portions 22-1, 22-3, and 22-4 and three convex portions 24-1, 24-3, and 24-4. Note that, the housing 10 may have any three of concave portions 22-1, 22-2, 22-3, and 22-4 and three convex portions 24 to correspond with the any three concave portions in the Z axis direction. In the present example also, it is possible to receive advantageous effect mentioned above, which is derived from the concave portions 22 and the convex portions 24.

Moreover, in the present example, if a plurality of semiconductor devices 100 is stacked up in the Z axis direction, it is possible to align in the same orientation the orientation of the semiconductor devices 100 in the X and Y axis directions. For example, it is possible to prevent a situation in which a semiconductor device 100 of the first layer is arranged with its lead frame 30-1 protruding in the +X direction and a semiconductor device 100 of the second layer is arranged with its lead frame 30-1 protruding in the –X direction. In this way, by aligning orientation of semiconductor devices 100, a task to take out the semiconductor devices 100 one by one from their stacked state and attaching it to another member, substrate, or the like can be facilitated, for example.

Figure 14:
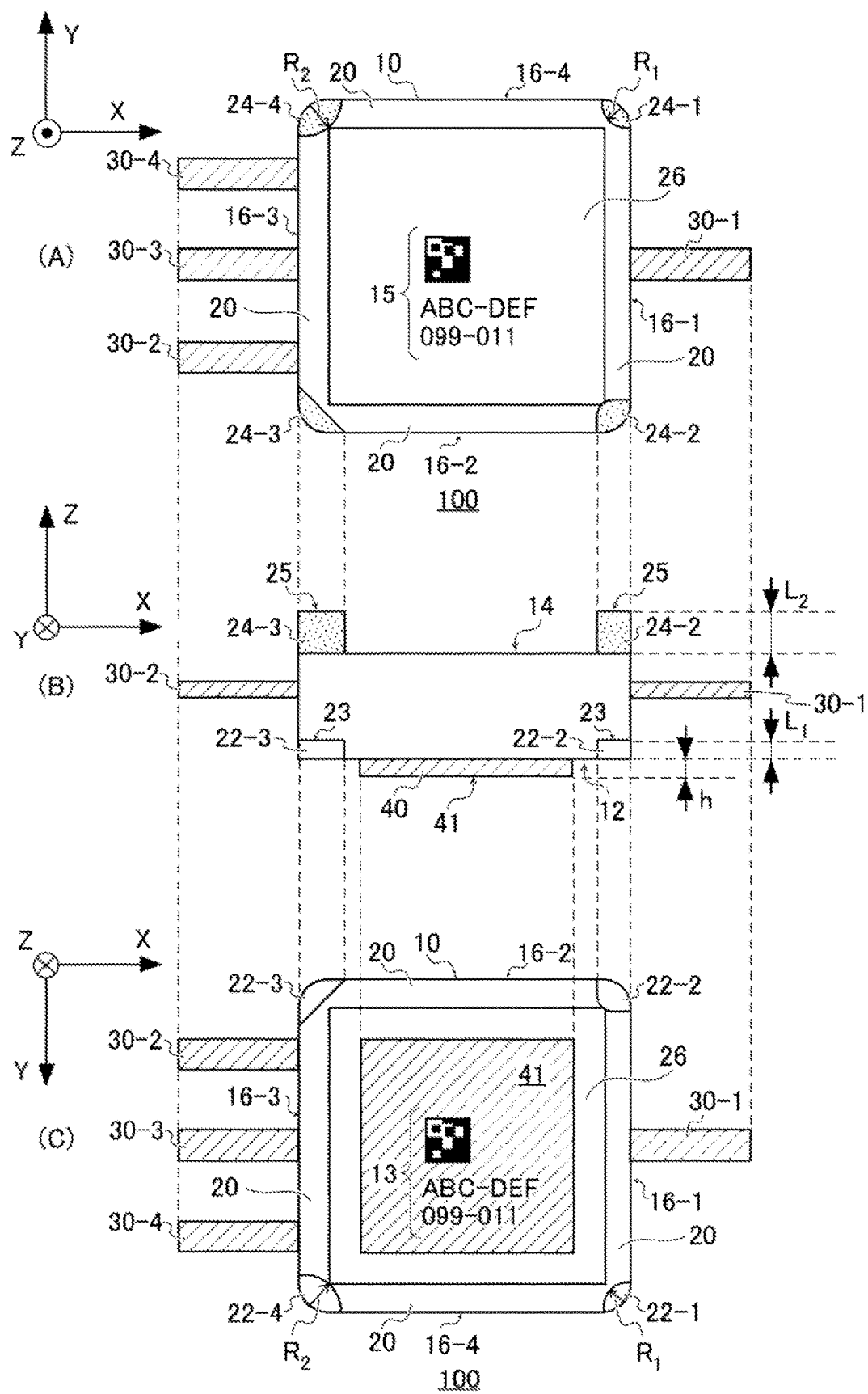
FIG. 14 illustrates the third modification examples of concave portions 22 and convex portions 24.

FIG. 14 illustrates the third modification examples of concave portions 22 and convex portions 24. (A) to (C) illustrate a top view, a side view, and a bottom view respectively, of a semiconductor device 100 in the third modification example. Similar to the example of FIG. 1, a housing 10 of the present example has four concave portions 22 and four convex portions 24. However, convex portions 24 of the present example have shapes different from each other in the second surface 14 as seen in a direction parallel with the Z axis direction.

As shown in (A) of FIG. 14, a convex portion 24-1 of the present example constitutes a part of a column with a radius R1. More specifically, the convex portion 24-1 of the present example includes one of four portions into which the column with the radius R1 is divided in the X-Y plane. Also, a convex portion 24-2 in the present example is made of a quadrangular prism and a convex portion 24-3 in the present example is made of a triangular prism. Moreover, a convex portion 24-4 in the present example constitutes a part of a column with radius R2 that is greater than the radius R1. More specifically, the convex portion 24-4 of the present example includes one of four portions into which the column with the radius R2 is divided in the X-Y plane. Note that, each of a part of a column may have a shape corresponding to a shape of a corner of a side surface 16 of the housing 10, and may not need to be a complete shape of one of four divisions into which a circle is divided.

Also, concave portions 22 have shapes different from each other in the first surface 12 as seen in a direction parallel with the Z axis direction. As shown in (C) of FIG. 14, the concave portions 22 of the present example have shapes correspond to the convex portions 24. If a plurality of housings 10 is made to overlap each other in the Z axis direction, the convex portions 24 have shapes to fit the concave portions 22 that are provided at corresponding positions in the Z axis direction.

In the present example also, it is possible to receive advantageous effect mentioned above, which is derived from the concave portions 22 and the convex portions 24. Moreover, if stacked up in the Z axis direction, it is possible to align orientation of semiconductor devices 100 in the X and Y axis directions. Note that, the features of the present example may be applied to the examples of FIG. 12 and FIG. 13.

Figure 15:
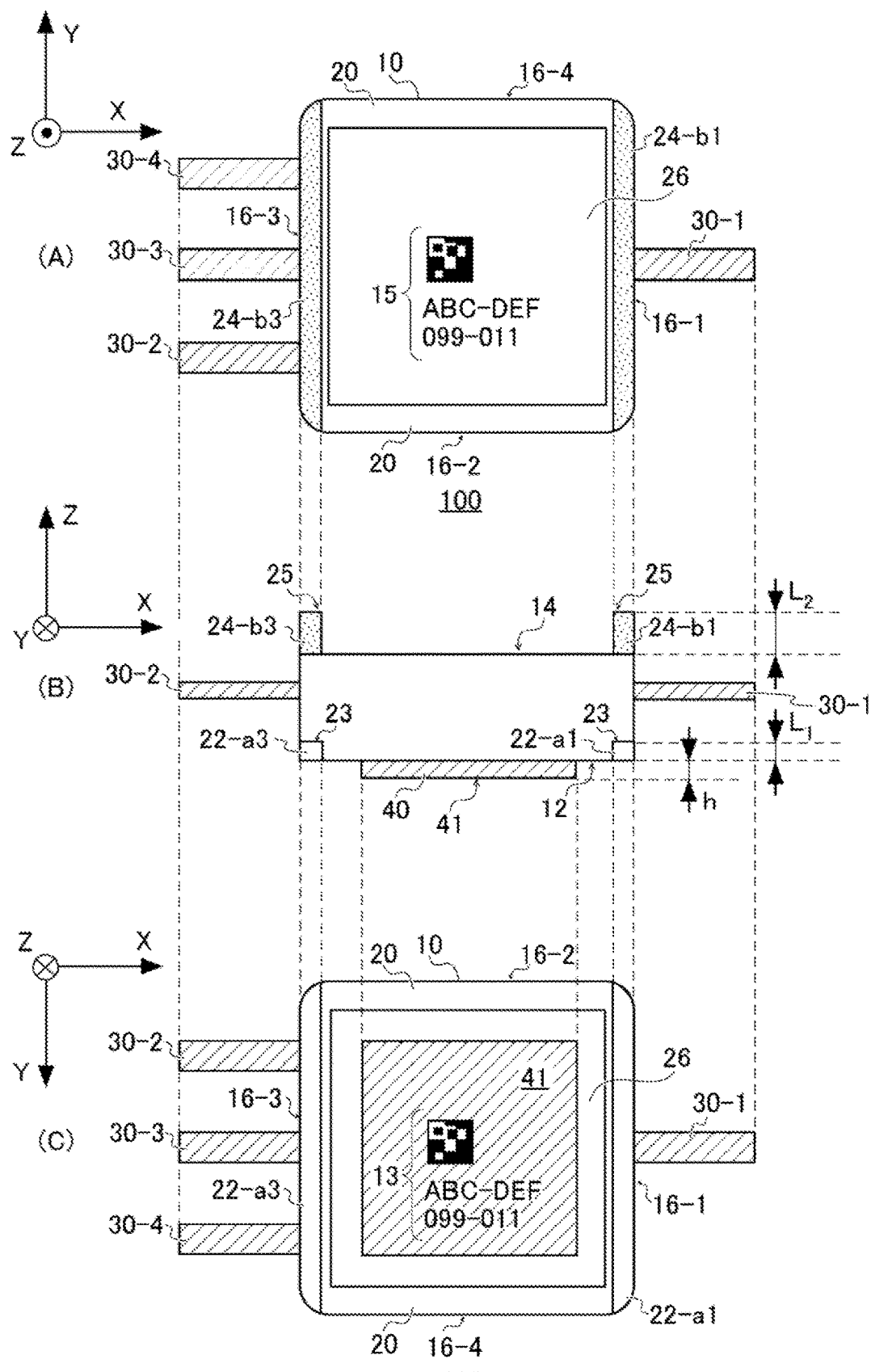
FIG. 15 illustrates the fourth modification examples of concave portions 22 and convex portions 24.

FIG. 15 illustrates the fourth modification examples of concave portions 22 and convex portions 24. (A) to (C) illustrate a top view, a side view, and a bottom view respectively, of a semiconductor device 100 in the fourth modification example. A housing 10 may have concave portions 22-*a* provided extending along two opposing sides of the first surface 12 of a rectangular shape respectively and convex portions 24-*b* provided extending along two opposing sides of the second surface 14 of a rectangular shape respectively. The housing 10 of the present example has concave portions 22-*a*1 and 22-*a*3 and convex portions 24-*b*1 and 24-*b*3. However, the housing 10 may have concave portions 22-*a*2 and 22-*a*4 and convex portions 24-*b*2 and 24-*b*4.

Although the concave portions 22 or convex portions 24 of the present example extend throughout each side respectively, concave portions 22 or convex portions 24 of another example may be provided at a part of each side respectively. If a length of the concave portion 22-*a*1 in the Y axis direction which extends in the Y axis direction is long compared to a length of the concave portion 22-*a*1 in the X axis direction, it may be deemed that the concave portion 22-*a*1 is provided at a part of one side. Similarly, if a length of a convex portion 24-*b*1 in the Y axis direction which extends in the Y axis direction is long compared to a length of the convex portion 24-*b*1 in the X axis direction, it may be deemed that the convex portion 24-*b*1 is provided at a part of one side. In the present example also, it is possible to receive advantageous effect mentioned above, which is derived from the concave portions 22 and the convex portions 24.

Figure 16:
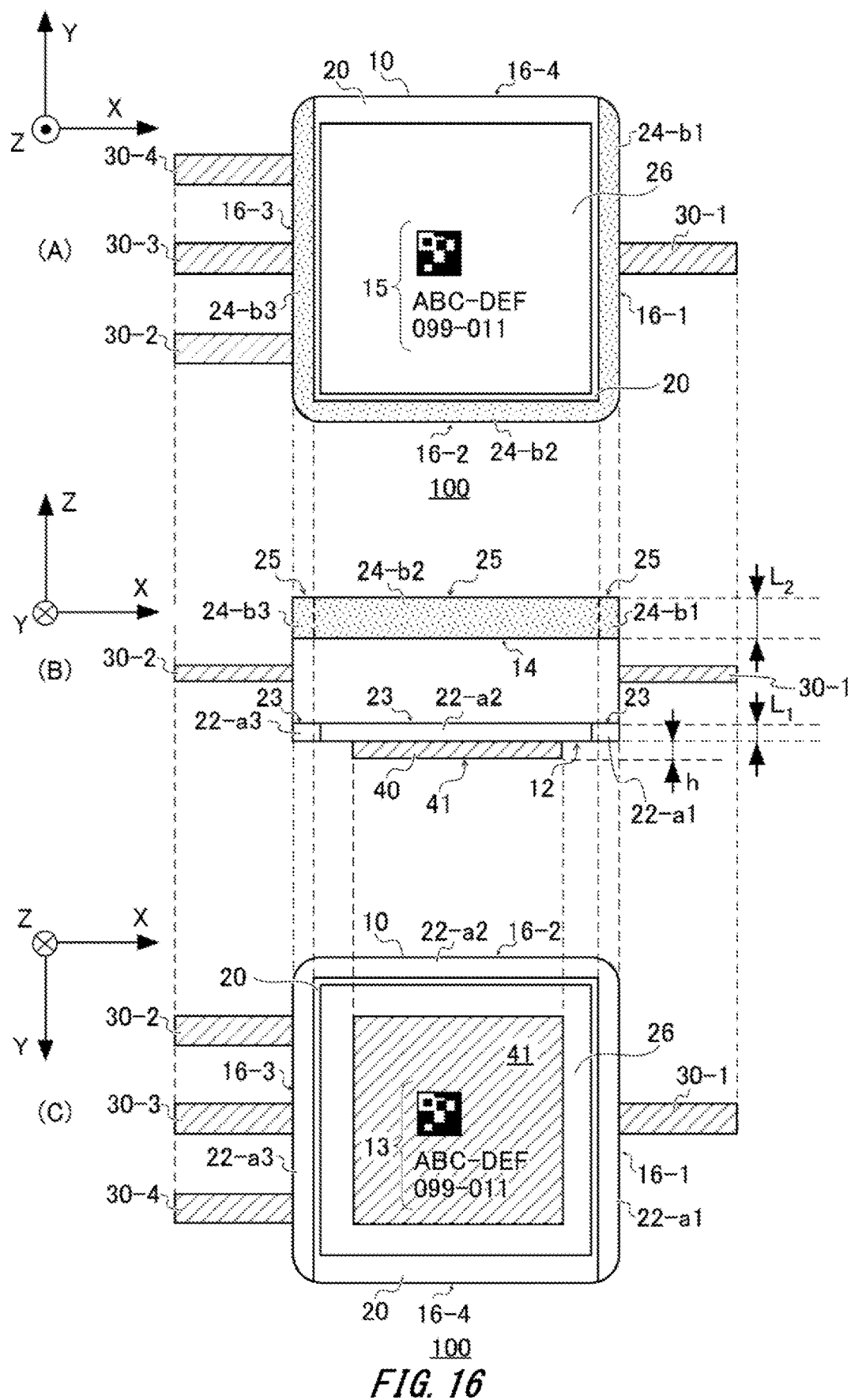
FIG. 16 illustrates the fifth modification examples of concave portions 22 and convex portions 24.

FIG. 16 illustrates the fifth modification examples of concave portions 22 and convex portions 24. (A) to (C) illustrate a top view, a side view, and a bottom view respectively, of a semiconductor device 100 in the fifth modification example. A housing 10 may have concave portions 22-*a* provided extending along three sides in the first surface 12 respectively and convex portions 24-*b* provided extending along three sides in the second surface 14 respectively. The housing 10 of the present example has concave portions 22-*a*1, 22-*a*2, and 22-*a*3 and convex portions 24-*b*1, 24-*b*2, and 24-*b*3. Note that, the housing 10 may have any three of concave portions 22-*a*1, 22-*a*2, 22-*a*3, and 22-*a*4 and three convex portions 24-*b* to correspond with the any three concave portions 22-*a* in the Z axis direction.

In the present example also, it is possible to receive advantageous effect mentioned above, which is derived from the concave portions 22 and the convex portions 24. Moreover, if stacked up in the Z axis direction, it is possible to align orientation of semiconductor devices 100 in the X and Y axis directions.

Figure 17:
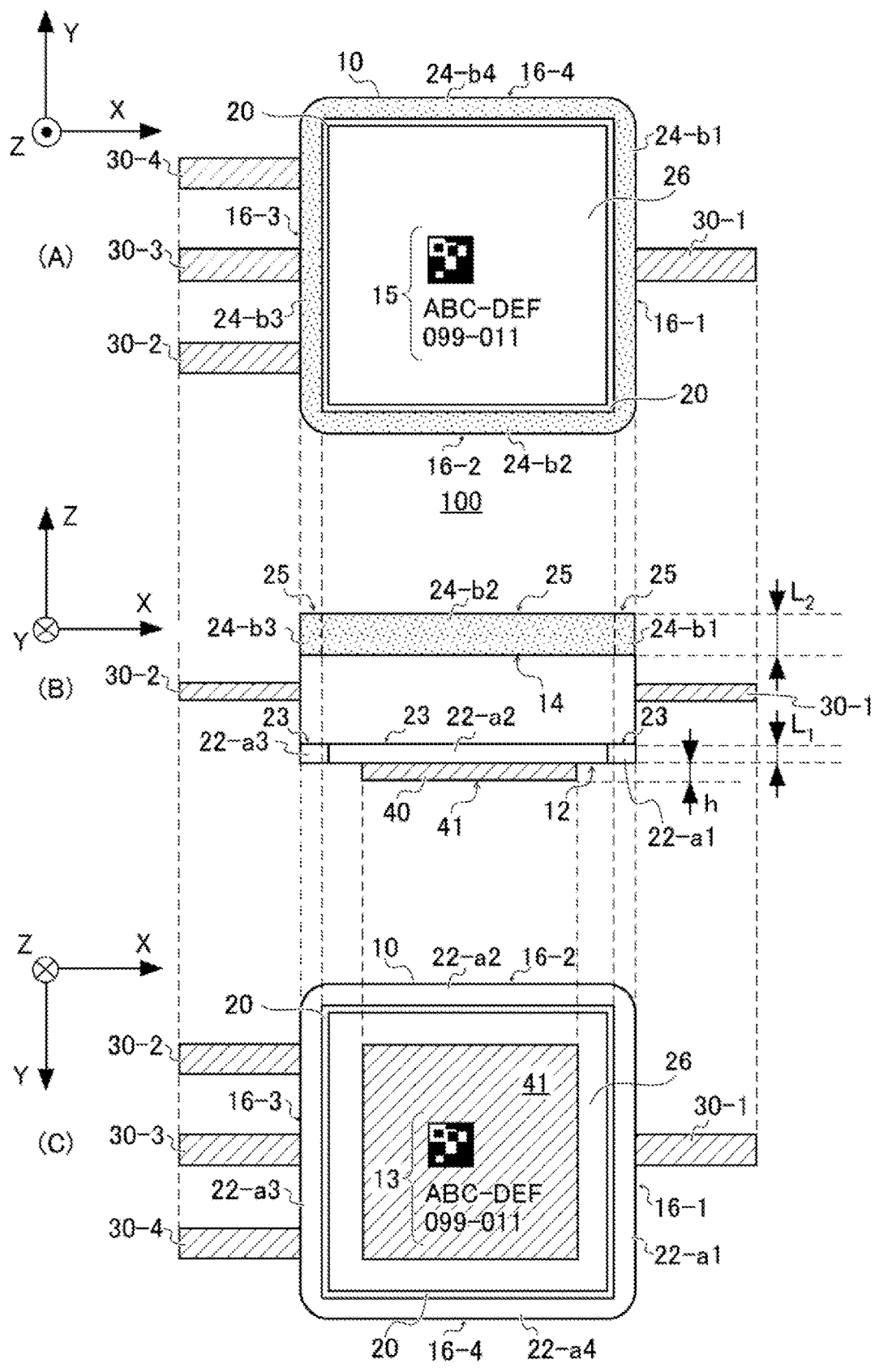
FIG. 17 illustrates the sixth modification examples of concave portions 22 and convex portions 24.

FIG. 17 illustrates the sixth modification examples of concave portions 22 and convex portions 24. (A) to (C) illustrate a top view, a side view, and a bottom view respectively, of a semiconductor device 100 in the sixth modification example. A housing 10 may have concave portions 22-*a* annularly provided on the first surface 12 and convex portions 24-*b* annularly provided on the second surface 14. Note that, to enumerate examples, the phrase 'annularly' includes an annular rectangle of which corners form right angles, an annular rectangle of which corners have curvature, and an annular circle.

Annularly provided concave portions 22-*a* and 24-*b* may have width in the X-Y plane direction. In this case, the inside of the width may be made of an annular rectangle of which corners have curvature, and the outer portion of the width may be made of an annular rectangle of which corners form right angles. In the present example also, it is possible to receive advantageous effect mentioned above, which is derived from the concave portions 22 and the convex portions 24.

Figure 18:
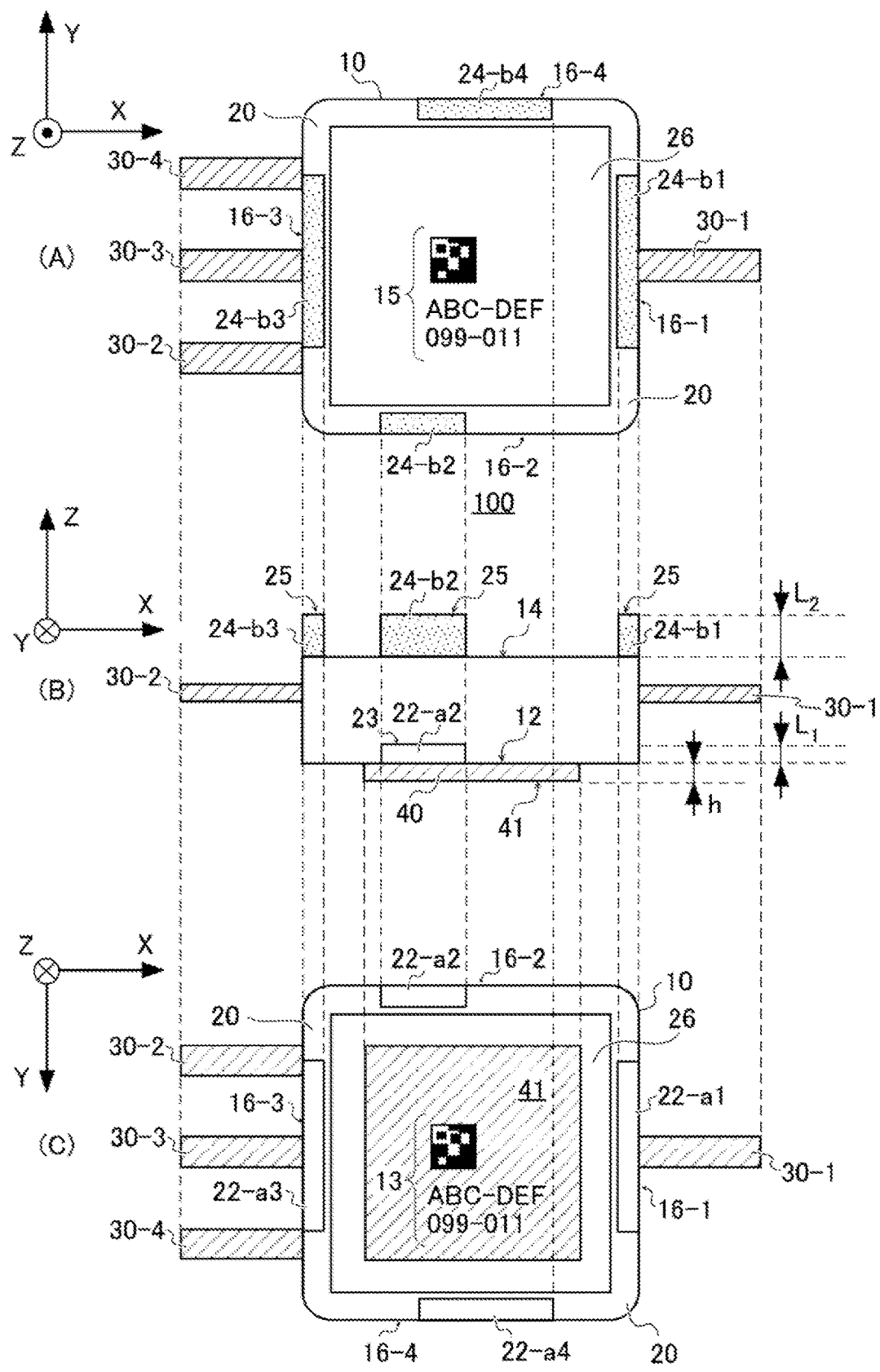
FIG. 18 illustrates the seventh modification examples of concave portions 22 and convex portions 24.

FIG. 18 illustrates the seventh modification examples of concave portions 22 and convex portions 24. (A) to (C) illustrate a top view, a side view, and a bottom view respectively, of a semiconductor device 100 in the seventh modification example. A housing 10 may have concave portions 22-*a* provided extending along four sides in the first surface 12 respectively and convex portions 24-*b* provided extending along four sides in the second surface 14 respectively. Note that, in the present example, the concave portions 22-*a* are provided at a part of four sides respectively, and the convex portions 24-*b* are provided at a part of four sides respectively.

A concave portion 22-*a*1 of the present example does not extend throughout one side of the first surface 12, and is provided at a part of the one side. In the present example, a length of the concave portion 22-*a*1 in the Y axis direction is long compared to a length of the concave portion 22-*a*1 in the X axis direction. The same relation is established in the other sides as well. In the present example also, it is possible to receive advantageous effect mentioned above, which is derived from the concave portions 22 and the convex portions 24.

Also, concave portions 22 (convex portions 24) provided to at least a pair of two opposing sides may not necessarily arranged point-symmetrically with respect to the center of the first surface 12 (the second surface 14). Also, an extending length of concave portions 22 (convex portions 24) provided to at least a pair of two opposing sides may be different from each other. Thereby, if semiconductor devices 100 are stacked up, it is possible to align orientation of the semiconductor devices 100 in the X and Y axis directions.

Figure 19:
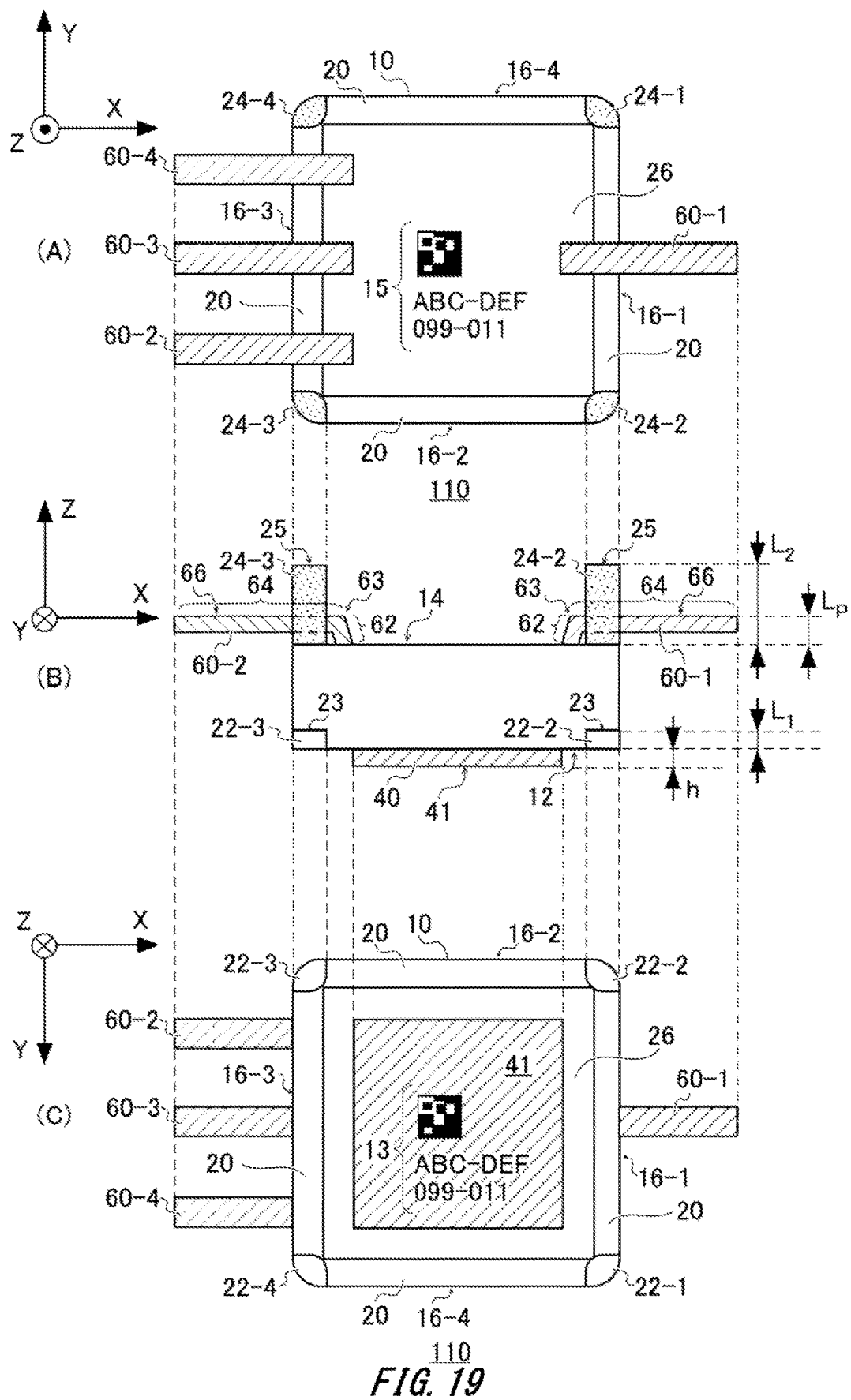
FIG. 19 illustrates a top view (A), a side view (B), and a bottom view (C) of a semiconductor device 110 in the second embodiment.

FIG. 19 illustrates a top view (A), a side view (B), and a bottom view (C) of a semiconductor device 110 in the second embodiment. The semiconductor device 110 of the present example has lead frames 60 to protrude from the second surface 14, instead of the lead frames 30 to protrude from the side surfaces 16 of the housing 10 shown in the first embodiment. Note that, the lead frames 60 of the present example are one example of external connection terminals.

The lead frames 60 of the present example have first regions 62, second regions 64, and bends 63. In the present example, the first regions 62 protrude from the second surface 14 to the +Z direction. Also, the second region 64 protrudes to the X axis direction from an end of the first region 62 opposite from the second surface 14 side. The bends 63 are positioned at connecting portions between the first regions 62 and second regions 64.

In the present example, a protruding length from the second surface 14 to ends 66 of the lead frames 60 in the Z axis direction is defined as a length $L_P$. Note that, the end 66 is an end of a lead frame 60 opposite from the second surface 14 side in the Z axis direction. That is, the length $L_P$ of the present example is a length from the second surface 14 to the maximum height positions of the second regions 64 in the Z axis direction.

In the present example, difference between the second length $L_2$ of convex portions 24 and the length $L_P$ ($L_2-L_P$) is greater than the first length $L_1$ of concave portions 22 (i.e. $L_1<L_2-L_P$). The semiconductor device 110 of the present example has a heat dissipation member 40 of which a protruding length h from the first surface 12 is a positive value. Hence, in the present example, $\{(L_2-L_P)-(L_1+h)\}$ is a positive value. Note that, in another example having a heat dissipation member 40 of which a protruding length h is zero, $(L_2-L_P-L_1)$ may be a positive value. Thereby, it is possible to receive advantageous effect mentioned above, which is derived from the concave portions 22 and the convex portions 24.

Figure 20:
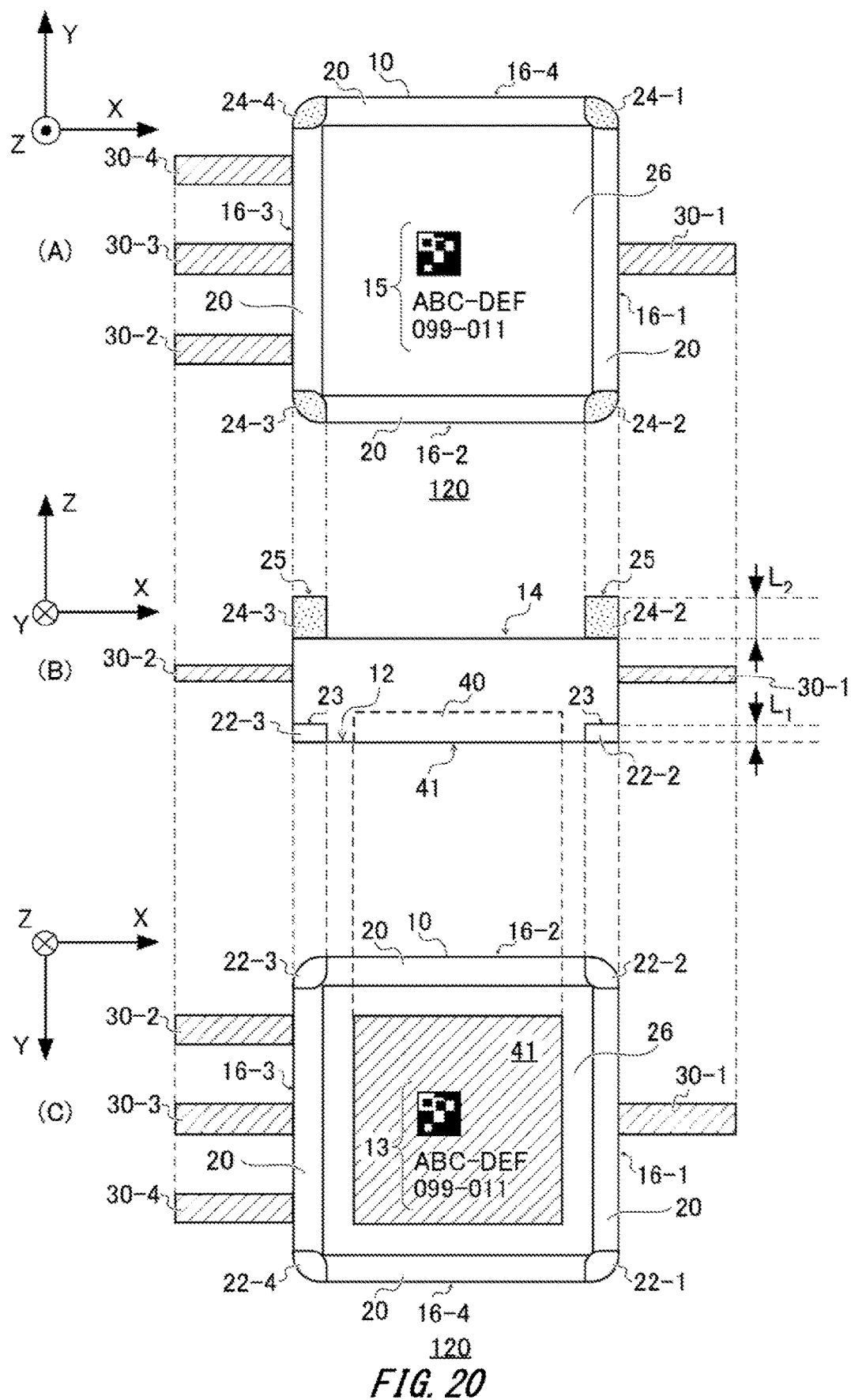
FIG. 20 illustrates a top view (A), a side view (B), and a bottom view (C) of a semiconductor device 120 in the third embodiment.

FIG. 20 illustrates a top view (A), a side view (B), and a bottom view (C) of a semiconductor device 120 in the third embodiment. In the third embodiment, a protruding length h of a heat dissipation member 40 is zero. Also, the semiconductor device 120 of the present example has lead frames 30 of the first embodiment. In the present example, the second length $L_2$ is greater than the first length $L_1$. That is, in the present example, $(L_2-L_1)$ is a positive value. Thereby, it is possible to receive advantageous effect mentioned above, which is derived from the concave portions 22 and the convex portions 24.

Figure 21:
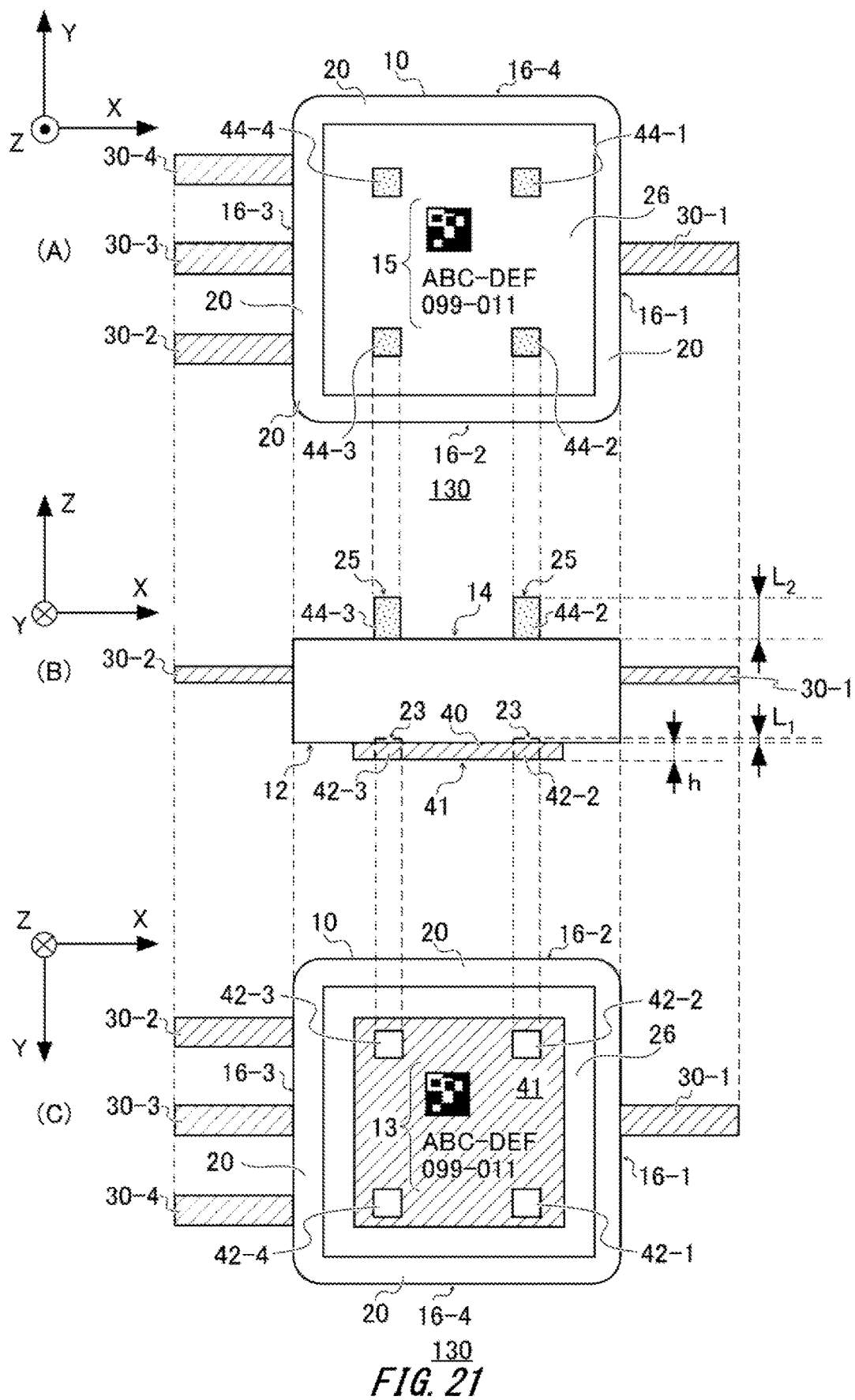
FIG. 21 illustrates a top view (A), a side view (B), and a bottom view (C) of a semiconductor device 130 in the fourth embodiment.

FIG. 21 illustrates a top view (A), a side view (B), and a bottom view (C) of a semiconductor device 130 in the fourth embodiment. A housing 10 of the present example has convex portions 44 provided in contact with the second surface 14. Also, on the first surface 12, a heat dissipation member 40 of the present example is externally exposed from the housing 10, and the heat dissipation member 40 has concave portions 42 provided to an end surface 41. Note that, in the present example also, the concave portions 42 and convex portions 44 are provided at positions corresponding to each other in the Z axis direction.

The concave portions 42 of the present example are arranged at positions that do not interfere with a piece of identification information 13. The concave portions 42 may be provided at any positions around the piece of identification information 13. Similarly, the convex portions 44 of the present example may be arranged at positions that do not interfere with a piece of identification information 15. The convex portions 44 may also be provided around the piece of identification information 15. In the present example, if $(L_2-L_1-h)$ is a positive value, it is possible to form clearance. In the present example also, it is possible to receive advantageous effect mentioned above, which is derived from the concave portions 22 and the convex portions 24.

Figure 22:
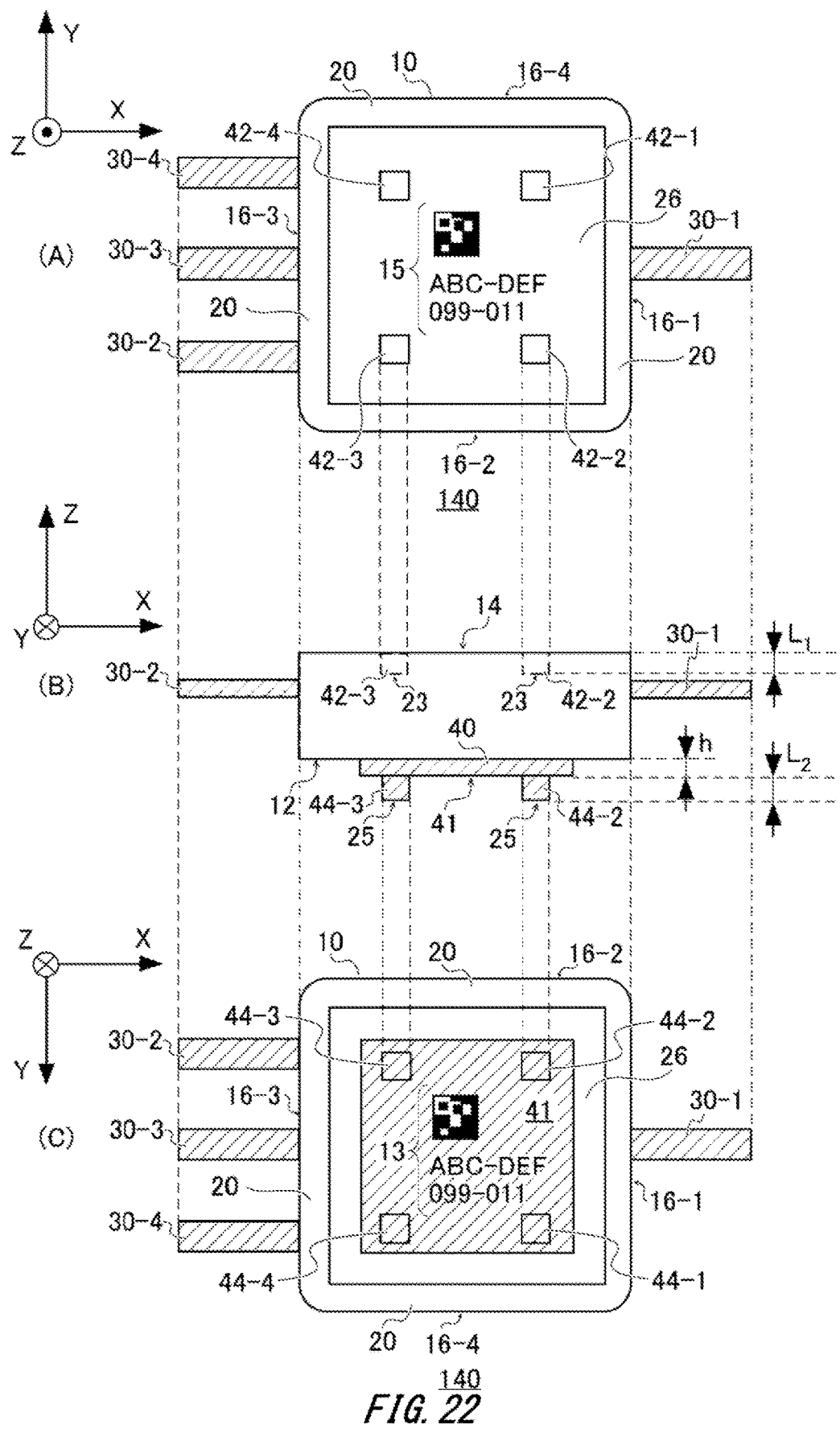
FIG. 22 illustrates a top view (A), a side view (B), and a bottom view (C) of a semiconductor device 140 in a modification example of the fourth embodiment.

FIG. 22 illustrates a top view (A), a side view (B), and a bottom view (C) of a semiconductor device 140 in a modification example of the fourth embodiment. In the present example, the second surface 14 is provided with concave portions 42, and convex portions 44 are provided in contact with an end surface 41 of a heat dissipation member 40. In light of these points, the fourth embodiment is modified. In the present example also, it is possible to receive advantageous effect mentioned above, which is derived from the concave portions 22 and the convex portions 24. Note that, the second length $L_2$ of the present example is a length from an end surface 41 of the heat dissipation member 40 to ends 25 of the convex portion 44. In the present example also, if $(L_2-L_1-h)$ is a positive value, it is possible to form clearance.

Figure 23:
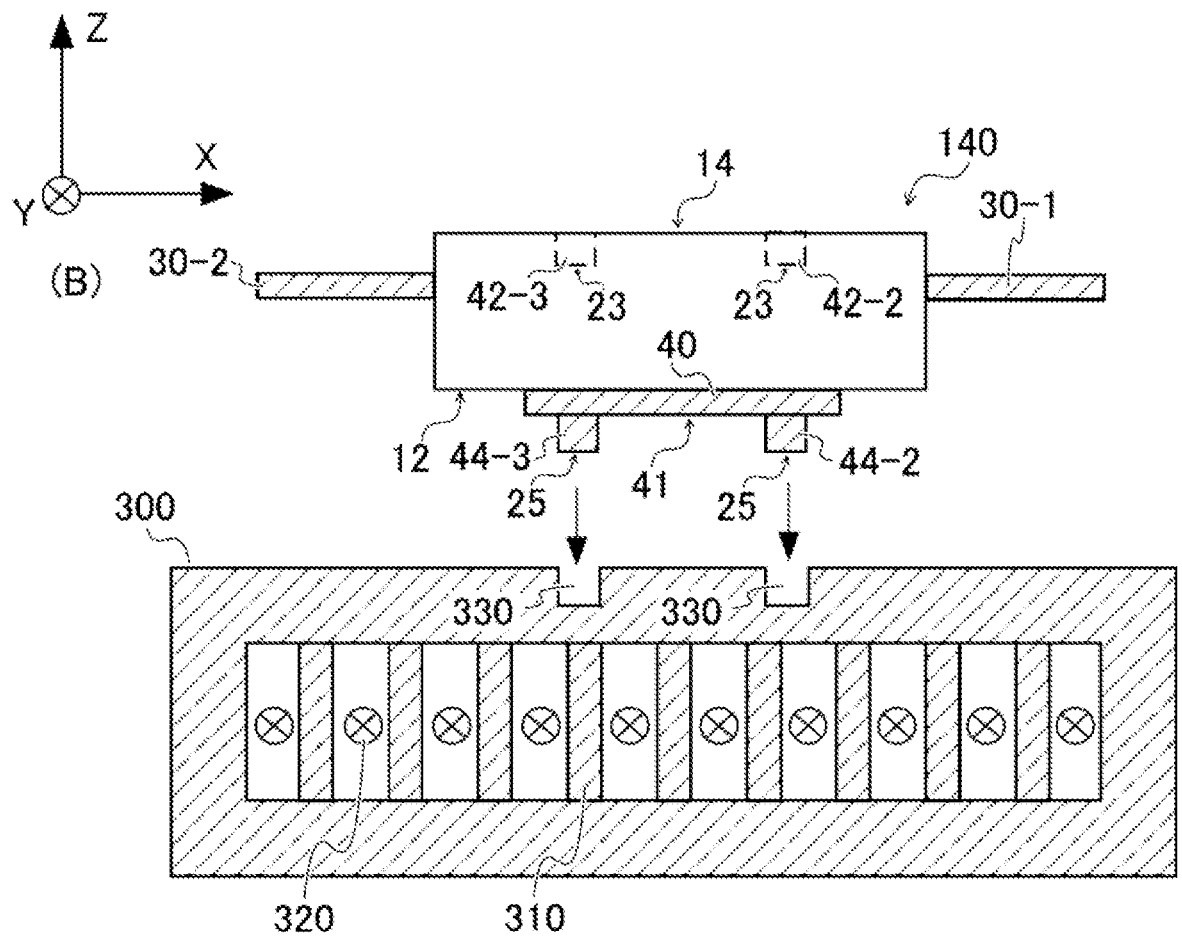
FIG. 23 illustrates a state of placing a semiconductor device 140 on a cooler 300.

FIG. 23 illustrates a state of placing a semiconductor device 140 on a cooler 300. The cooler 300 has a plurality of fins 310 to extend in the Y axis direction. The fins 310 may be spaced apart from each other in the X axis direction. Coolant fluid 320 may flow in the +Y direction between two fins 310 adjacent to each other. Heat to be emitted from semiconductor chips 50 may be cooled by exchanging the heat with the fins 310 and the coolant fluid 320.

The cooler 300 of the present example has concave portions 330 to fit convex portions 44 of the semiconductor device 140. The concave portions 330 may be utilized for positioning the semiconductor device 140 relative to the cooler 300. In the present example, because a relative position between the cooler 300 and the semiconductor device 140 is decided in advance by using the convex portions 44 and the concave portions 330, it is possible to perform a task to place the semiconductor device 140 on the cooler 300 in a short period of time. Note that, if the heat dissipation member 40 has concave portions 42, the cooler 300 may have convex portions to fit the concave portions 42.

Figure 24:
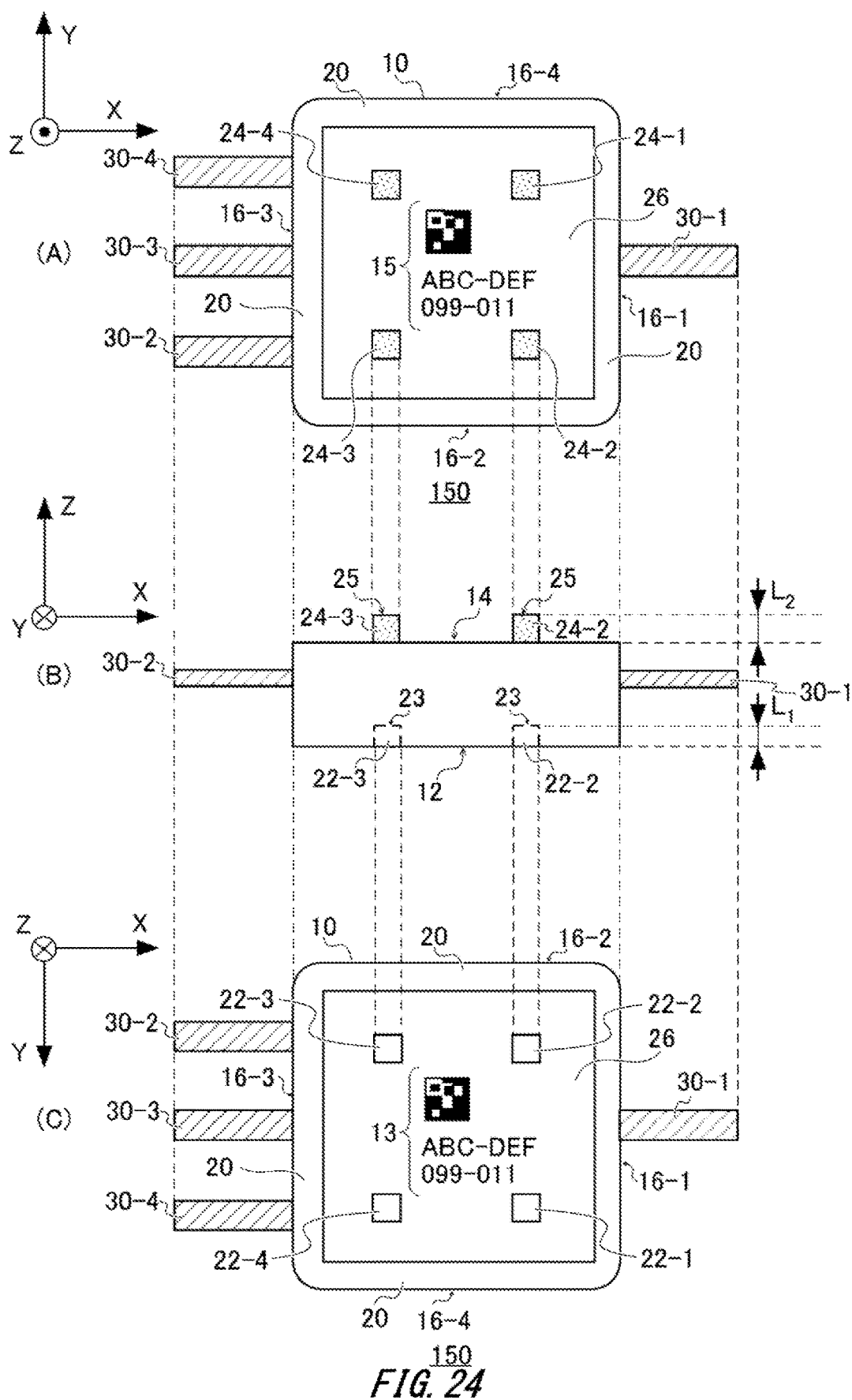
FIG. 24 illustrates a top view (A), a side view (B), and a bottom view (C) of a semiconductor device 150 in the fifth embodiment.

FIG. 24 illustrates a top view (A), a side view (B), and a bottom view (C) of a semiconductor device 150 in the fifth embodiment. The semiconductor device 150 of the present example does not have a heat dissipation member 40. The semiconductor device 150 is a discrete semiconductor chip, for example. In the present example, the first surface 12 and the second surface 14 on a housing 10 are surfaces of a resin sealing member 26.

The resin sealing member 26 may be provided with concave portions 22 and convex portions 24. The convex portions 24 of the present example constitute a part of a resin sealing member 26 in contact with the first surface 12. However, the convex portions 24 may be formed of glass having hardness higher than a resin material. Compared to a case in which the convex portions 24 are formed of the resin sealing member 26, if convex portions 24 are formed of a material different from that of the resin sealing member 26, it is possible to simplify formation of the housing 10 in some cases.

The concave portions 22 of the present example are arranged at positions that do not interfere with a piece of identification information 13. The concave portions 22 may be provided at any positions around the piece of identification information 13. Similarly, the convex portions 24 of the present example are arranged at positions that do not interfere with a piece of identification information 15. The convex portions 24 may also be provided around the piece of identification information 15. In the present example also, the second length $L_2$ may be greater than the first length $L_1$. Thereby, it is possible to receive advantageous effect mentioned above, which is derived from the concave portions 22 and the convex portions 24.

Note that, just like the first embodiment, four locations on the first surface 12 may be provided with the concave portions 22 respectively, and four locations on the second surface 14 may be provided with the convex portions 24 respectively. Also, needless to say that features shown from FIG. 9 to FIG. 18 may be applied to the present example.

As mentioned above, the semiconductor device 150 of the present example does not have a heat dissipation member 40. However, if the heat dissipation member 40 is provided just like the first to the fourth embodiments, the heat dissipation member 40 may be externally exposed from the first surface 12 or the second surface 14. For example, if the heat dissipation member 40 is externally exposed on the first surface 12, an end surface 41 of the heat dissipation member 40 is provided with the piece of identification information 13, instead of provided the first surface 12 with the piece of identification information 13. Instead of this, if the heat dissipation member 40 is externally exposed on the second surface 14, an end surface 41 of the heat dissipation member 40 may be provided with the piece of identification information 15, instead of providing the second surface 14 with the piece of identification information 15.

Figure 25:
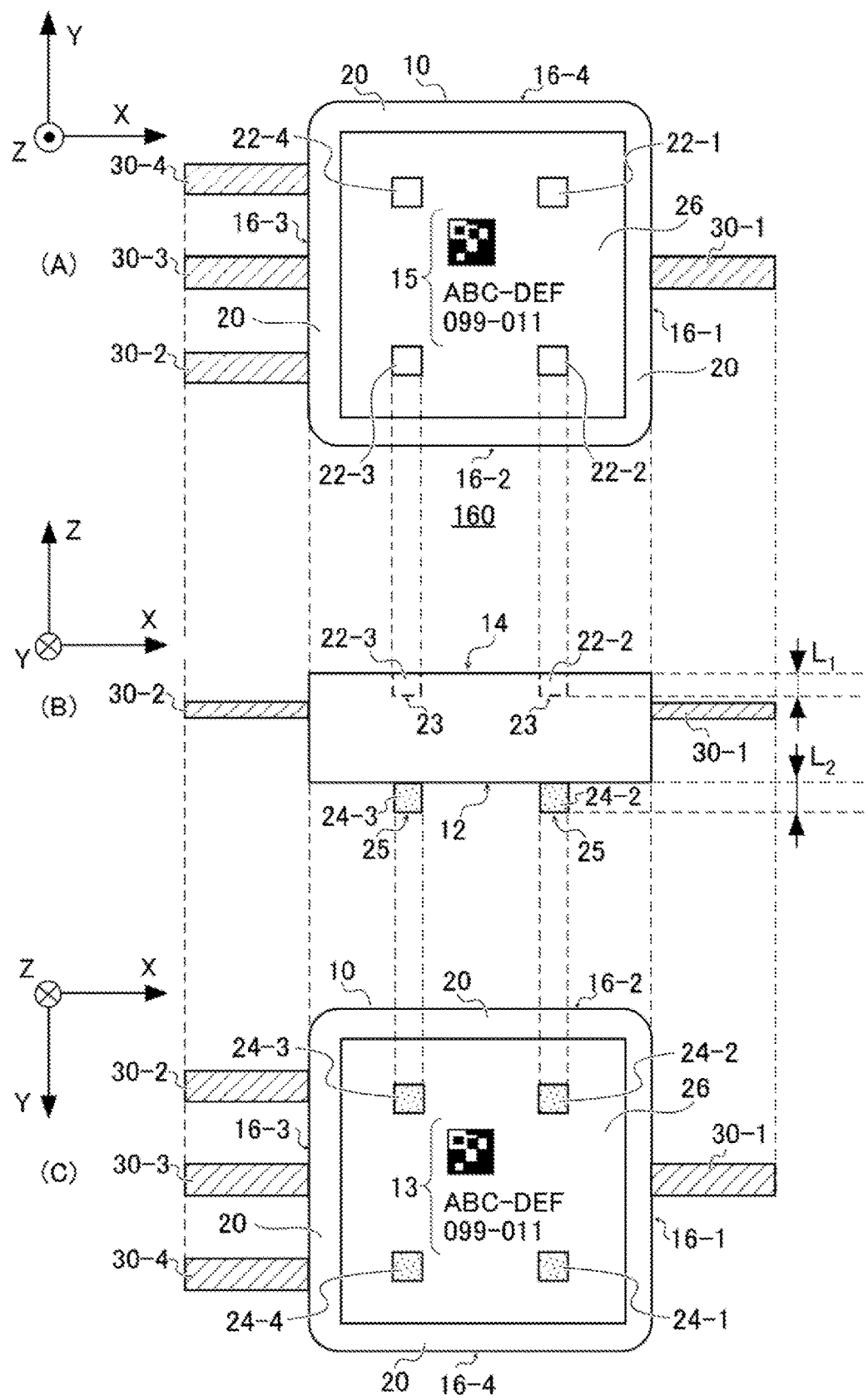
FIG. 25 illustrates a top view (A), a side view (B), and a bottom view (C) of a semiconductor device 160 in a modification example of the fifth embodiment.

FIG. 25 illustrates a top view (A), a side view (B), and a bottom view (C) of a semiconductor device 160 in a modification example of the fifth embodiment. In the present example, convex portions 24 are provided in contact with the first surface 12 and the second surface 14 is provided with concave portions 22. In light of these points, the present example is different from the fifth embodiment. The present example is the same as the fifth embodiment except for those points.

Figure 26:
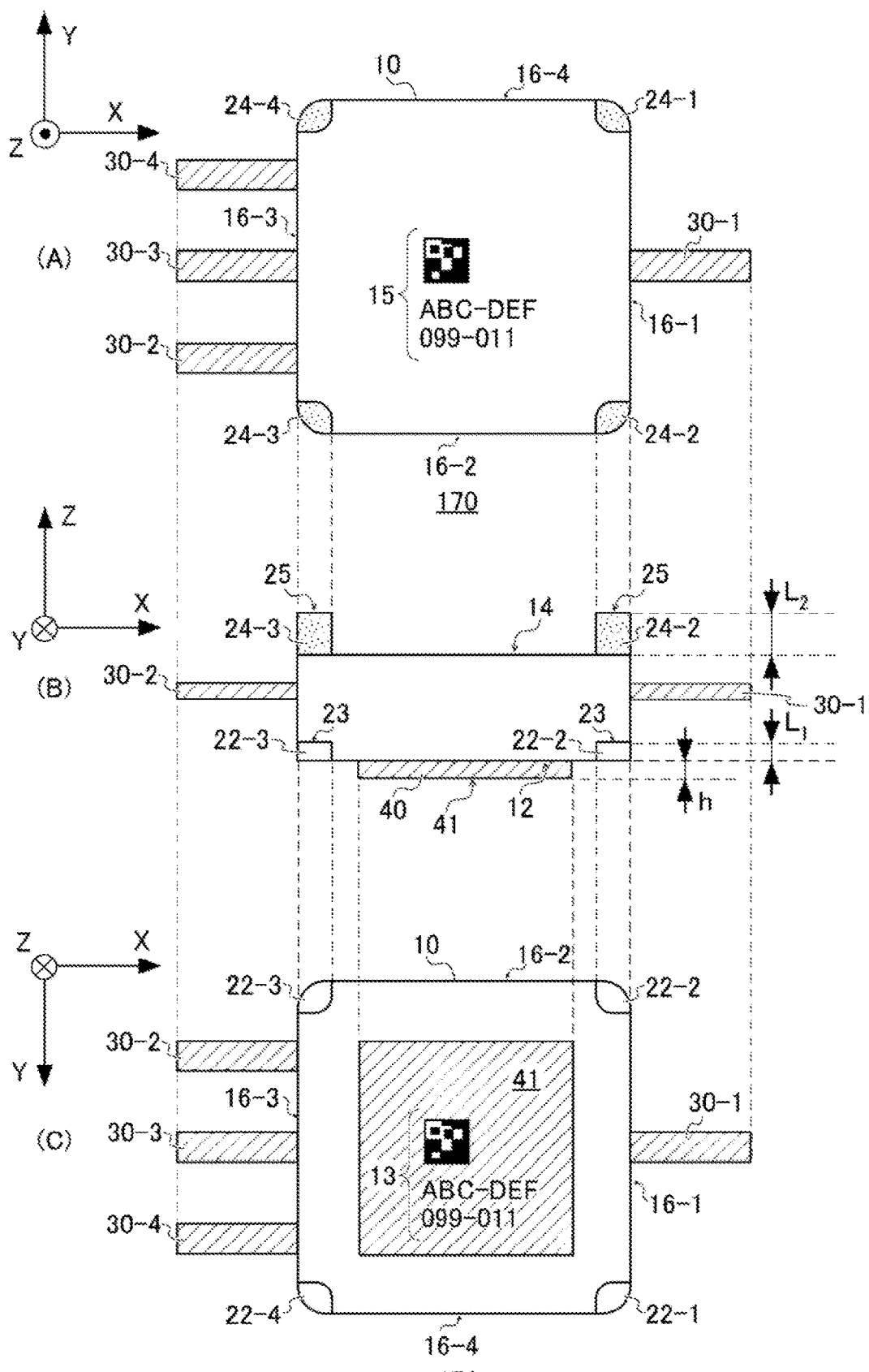
FIG. 26 illustrates a top view (A), a side view (B), and a bottom view (C) of a semiconductor device 170 in the sixth embodiment.

FIG. 26 illustrates a top view (A), a side view (B), and a bottom view (C) of a semiconductor device 170 in the sixth embodiment. A housing 10 of the present example does not have a frame member 20 and a resin sealing member 26. The housing 10 of the present example is formed by so-called transfer molding in which resin such as epoxy resin is poured into a mold to perform mold forming. Hence, the first surface 12, the second surface 14, and side surfaces 16 of the housing 10 of the present example are formed of the same resin material respectively. Note that, the side surfaces 16 are positioned between the first surface 12 and the second surface 14 in the Z axis direction.

Concave portions 22 of the present example may correspond to gate portions for injecting the resin material into a mold in transfer molding. Hence, the fact that ends 23 of the concave portions 22 is formed of the same resin material as the first surface 12 or the like may be deemed as a feature to indicate that the housing 10 is formed by transfer molding.

Note that, the concave portions 22 and convex portions 24 may function as ejector portions for pushing out the housing 10 from the mold after pouring molding resin into the mold. For example, ejector pins provided in the mold push out the concave portions 22 or the convex portions 24 from the mold to the outside. Thereby, the housing 10 may be taken out from the mold. The present example is advantageous in that the mold may not need to be provided with additional concave portions and convex portions in addition to the gate portions and the ejector portions.

The semiconductor device 170 of the present example includes a heat dissipation member 40 that is externally exposed on the first surface 12. Also, corners of four locations in the first surface 12 are provided with the concave portions 22 respectively, and corners of four locations in the second surface 14 are provided with the convex portions 24 respectively. In the present example also, clearance ($L_2-L_1-h$) may have a positive value. Thereby, it is possible to receive advantageous effect mentioned above, which is derived from the concave portions 22 and the convex portions 24. Note that, as a modification example of the present example, just like the example shown in FIG. 11, the heat dissipation member 40 may be externally exposed on the second surface 14.

Figure 27:
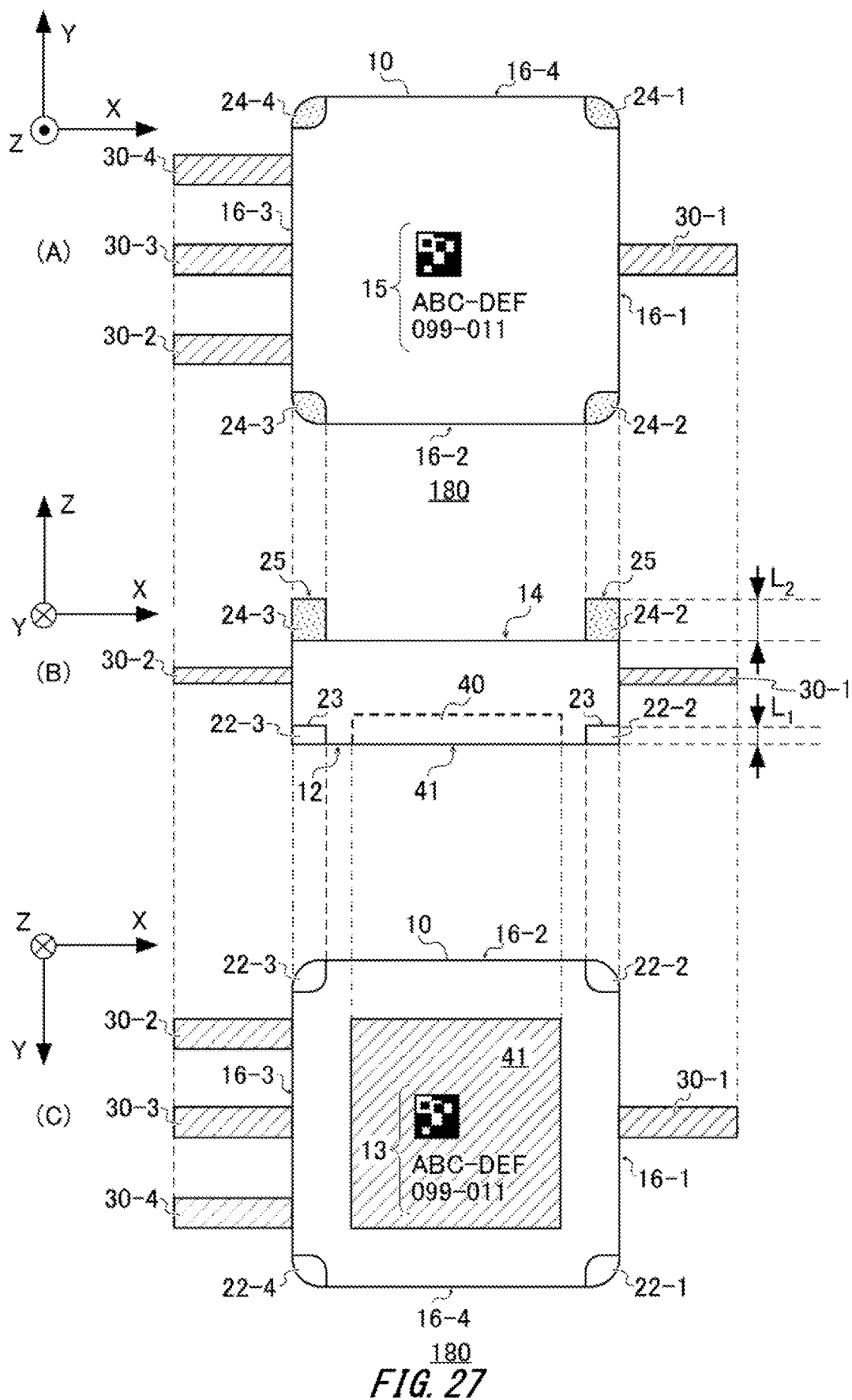
FIG. 27 illustrates a top view (A), a side view (B), and a bottom view (C) of a semiconductor device 180 in the seventh embodiment.

FIG. 27 illustrates a top view (A), a side view (B), and a bottom view (C) of a semiconductor device 180 in the seventh embodiment. In the present example, a protruding length h of a heat dissipation member 40 is zero. In light of this point, the present example is different from the sixth embodiment. In the present example, if ($L_2-L_1$) is a positive value, it is possible to receive advantageous effect mentioned above, which is derived from concave portions 22 and convex portions 24.

Figure 28:
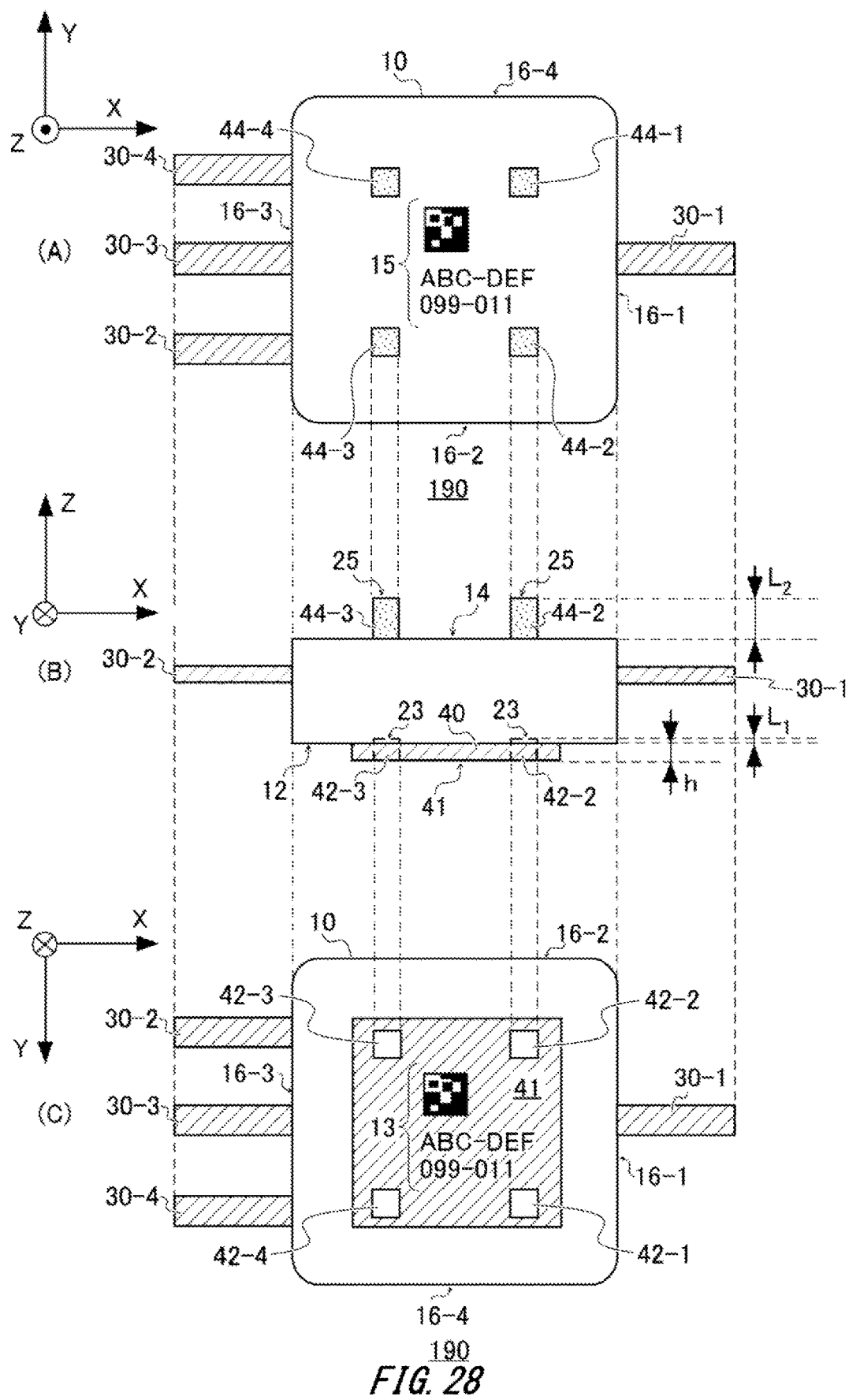
FIG. 28 illustrates a top view (A), a side view (B), and a bottom view (C) of a semiconductor device 190 in the eighth embodiment.

FIG. 28 illustrates a top view (A), a side view (B), and a bottom view (C) of a semiconductor device 190 in the eighth embodiment. Similar to the fourth embodiment (FIG. 21), an end surface 41 of a heat dissipation member 40 is provided with concave portions 42 of the present example. Also, convex portions 44 of the present example are provided at positions corresponding to the concave portions 42 in the Z axis direction, and are provided in contact with the second surface 14. In light of these points, the present example is different from the sixth embodiment. Note that, as a modification example of the present example, similar to the modification example of the fourth embodiment (FIG. 22), the convex portions 44 may be provided in contact with the end surface 41, and the second surface 14 may be provided with concave portions 42.

Figure 29:
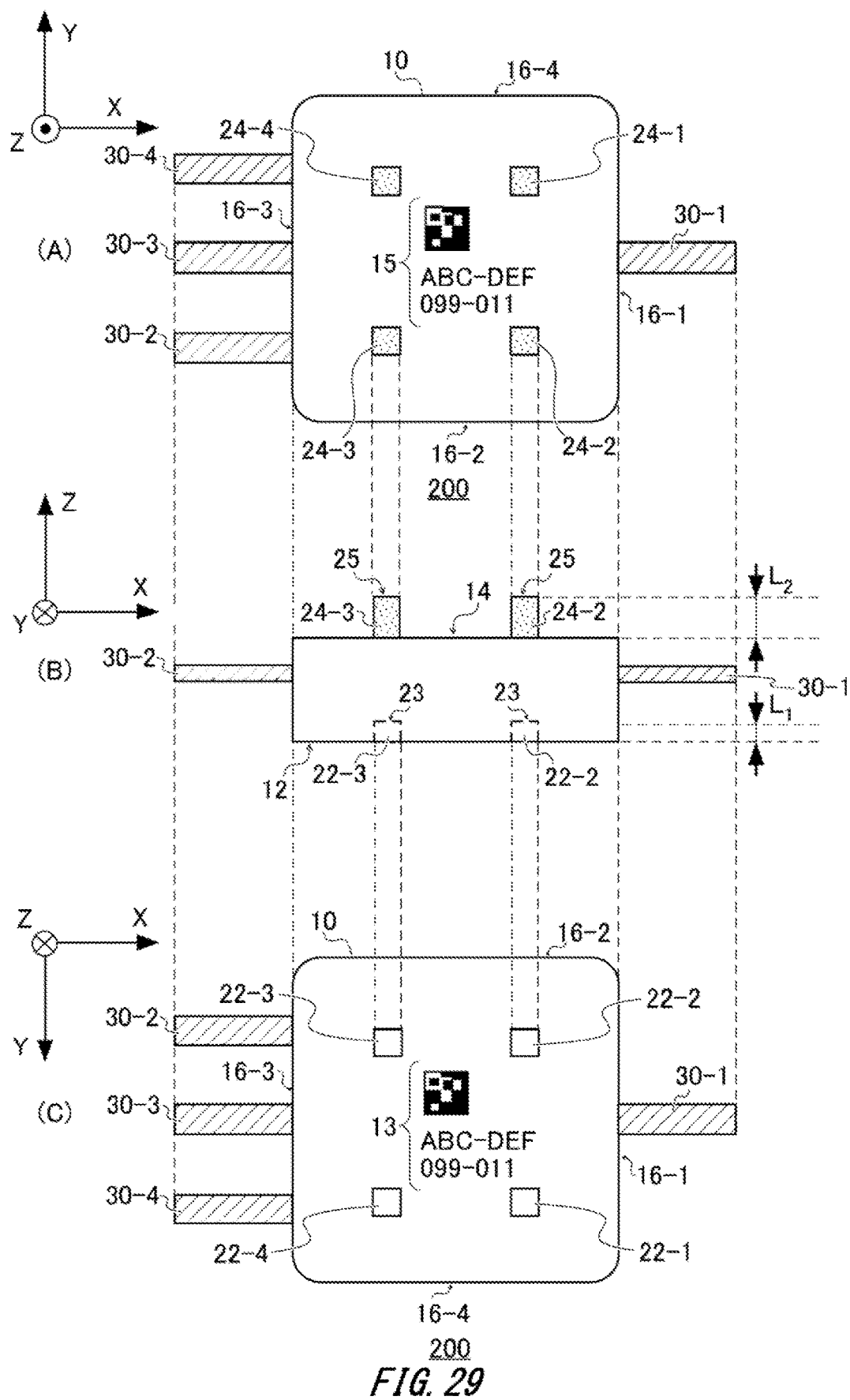
FIG. 29 illustrates a top view (A), a side view (B), and a bottom view (C) of a semiconductor device 200 in the ninth embodiment.

FIG. 29 illustrates a top view (A), a side view (B), and a bottom view (C) of a semiconductor device 200 in the ninth embodiment. Similar to the fifth embodiment (FIG. 24), a semiconductor device 200 of the present example does not have a heat dissipation member 40. In light of this point, the present example is different from the sixth embodiment.

Figure 30:
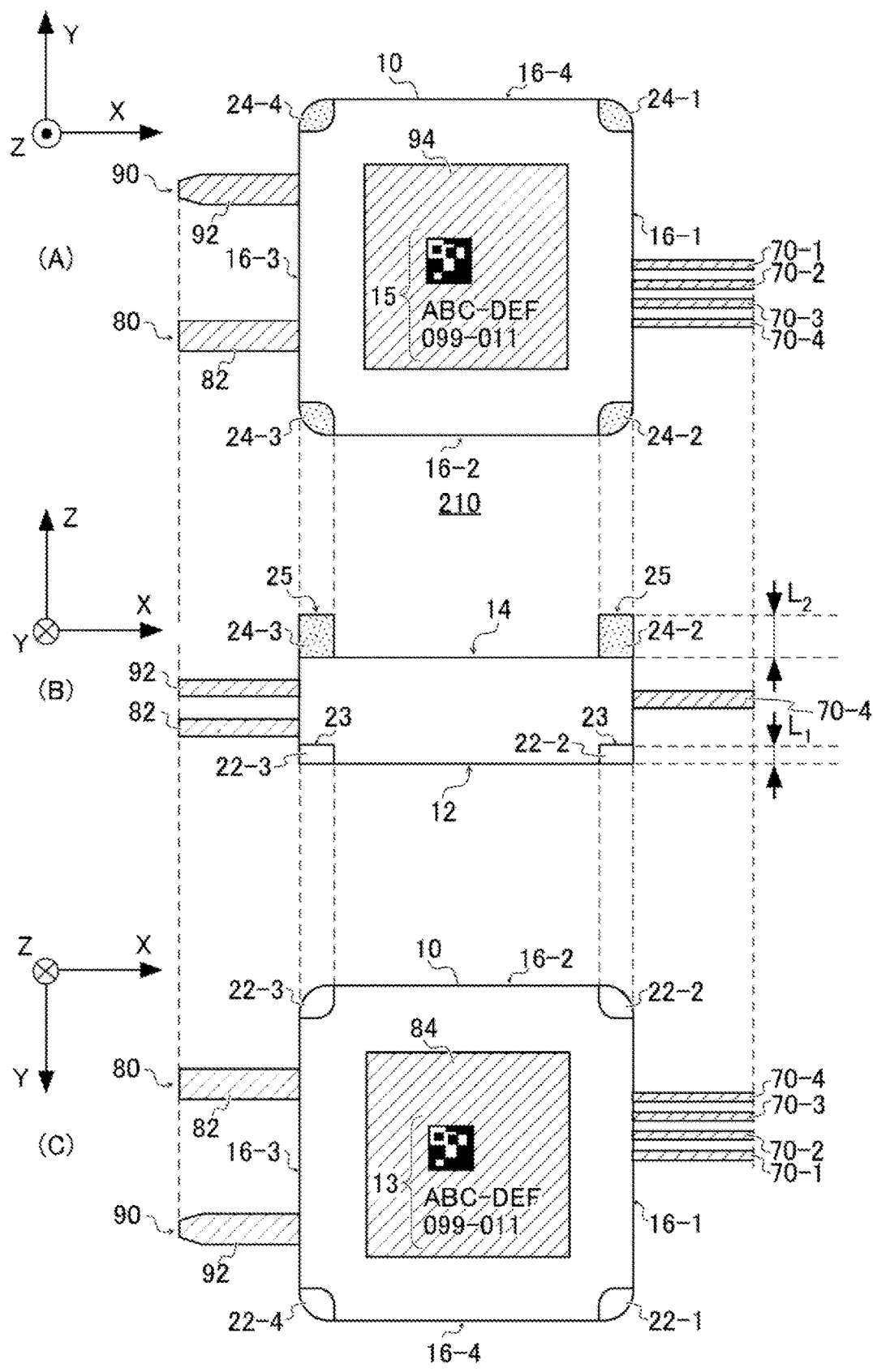
FIG. 30 illustrates a top view (A), a side view (B), and a bottom view (C) of a semiconductor device 210 in the tenth embodiment.

FIG. 30 illustrates a top view (A), a side view (B), and a bottom view (C) of a semiconductor device 210 in the tenth embodiment. The semiconductor device 210 of the present example has a lead frame 80 externally exposed on the first surface 12, and a lead frame 90 externally exposed on the second surface 14. The semiconductor device 210 may be cooled via the lead frames 80 and 90 externally exposed.

Similar to the sixth embodiment (FIG. 26), a housing 10 of the present example may be a resin housing formed by transfer molding. Hence, in the present example also, it is possible to receive advantageous effect mentioned above, which is derived from concave portions 22 and convex portions 24. The semiconductor device 210 of the present example has lead frames 70-1 to 70-4 protruding from a side surface 16-1. The lead frames 70-1 to 70-4 may be gate connecting components in the semiconductor device 210. Also, the lead frame 80 is an emitter (or a cathode) connecting component in the semiconductor device 210. The lead frame 90 is a collector (or an anode) connecting component in the semiconductor device 210.

The lead frame 80 includes the first region 82 protruding from a side surface 16-3, and the second region 84 externally exposed on the first surface 12. Also, the lead frame 90 includes the first region 92 protruding from the side surface 16-3, and the second region 94 externally exposed on the second surface 14. In the present example, the second region 84 and the second region 94 function as heat dissipation members 40 of the first embodiment etc. That is, the semiconductor device 210 of the present example can be cooled from both surfaces of the first surface 12 and the second surface 14. However, an insulating substrate may be provided between the second region 84 and a cooler 300, and between the second region 94 and a cooler 300.

Figure 31:
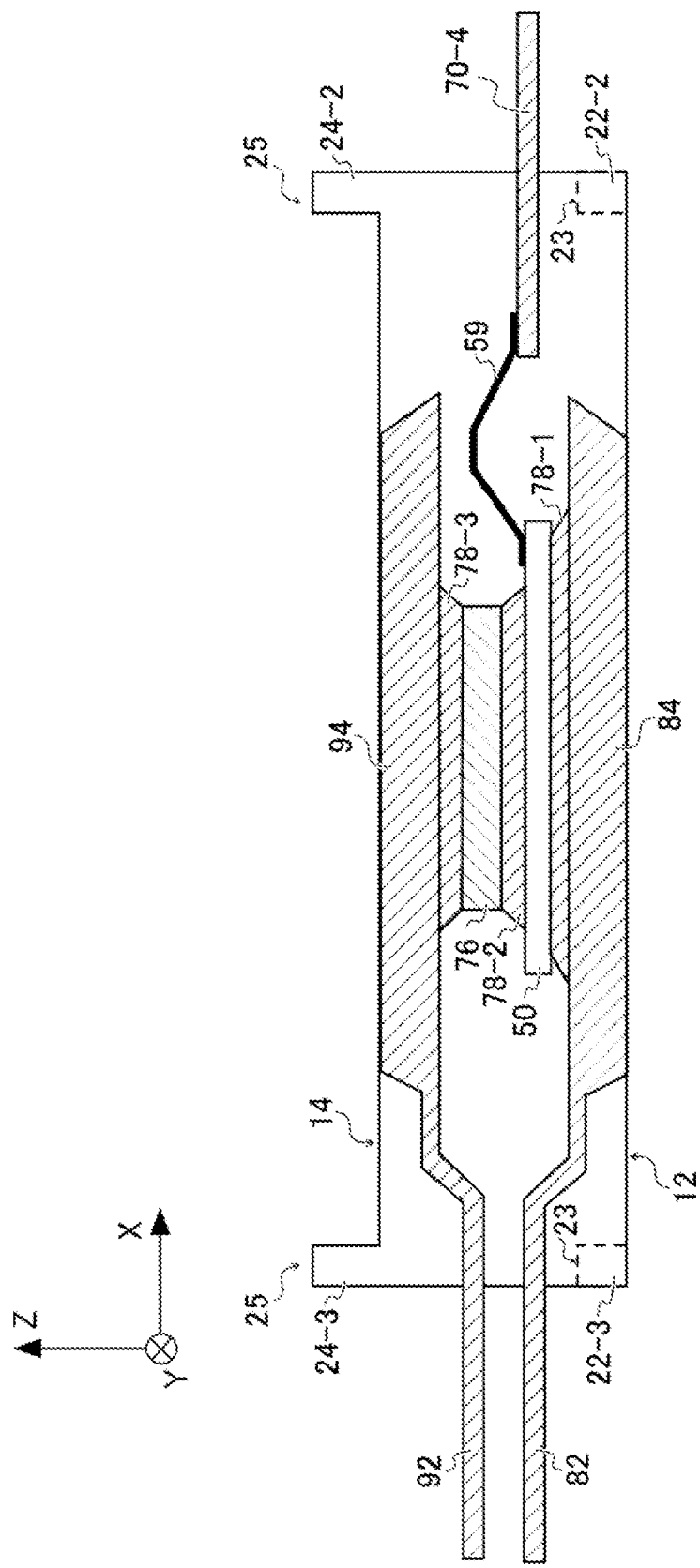
FIG. 31 illustrates the inside of a housing 10 in the side view (B) of FIG. 30.

FIG. 31 illustrates inside of the housing 10 in the side view (B) of FIG. 30. A collector electrode of a semiconductor chip 50 may be electrically connected to the second region 84 of the lead frame 80 via a solder layer 78-1. An emitter electrode of the semiconductor chip 50 may be electrically connected to the second region 94 of the lead frame 90 via a solder layer 78-2, a conductive spacer 76, and a solder layer 78-3. Also, a gate metal layer of a semiconductor chip 50 may be connected to the lead frames 70-1 to 70-4 via wires 59.

Figure 32:
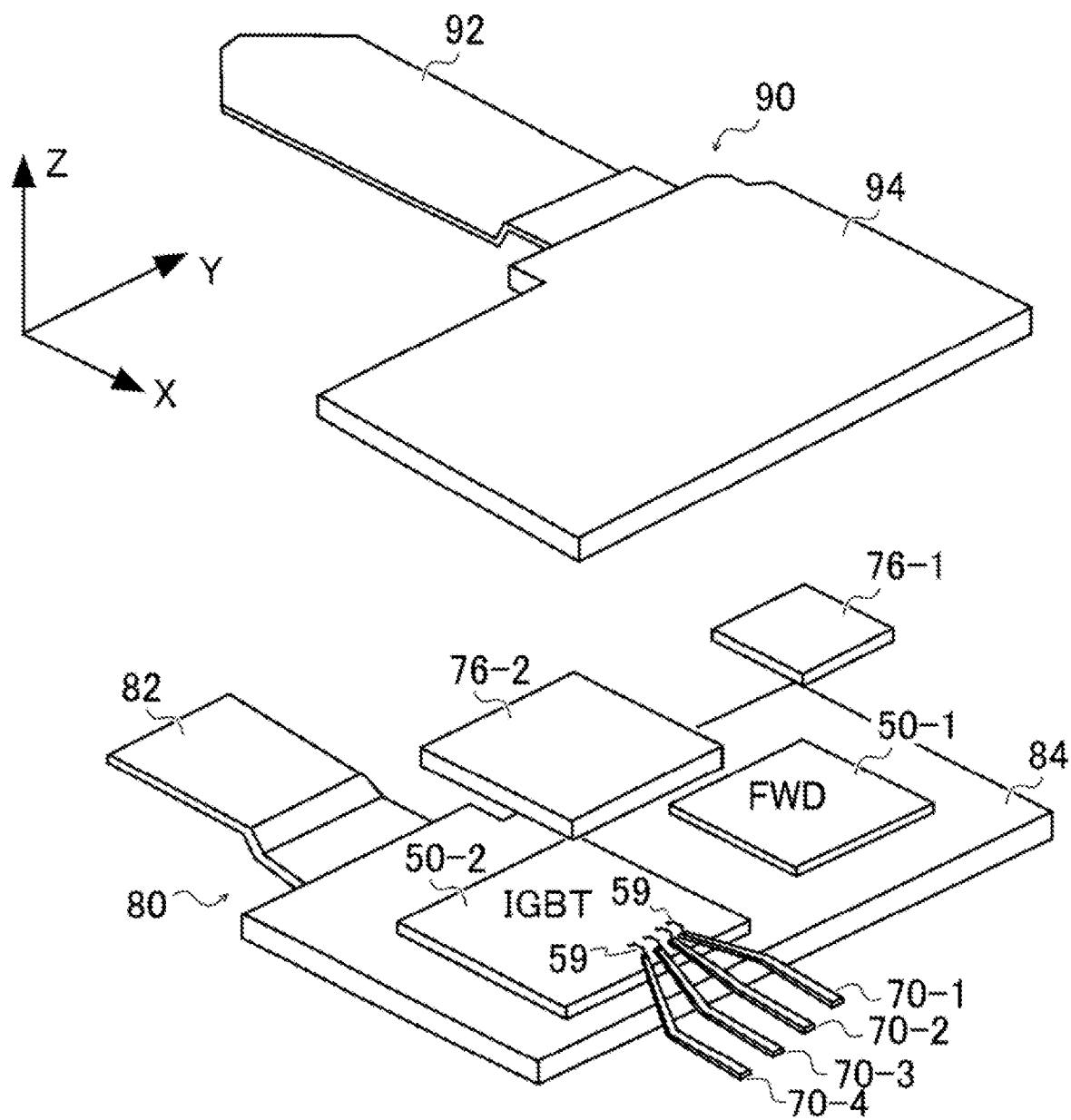
FIG. 32 is an exploded perspective view of a semiconductor device 210.

FIG. 32 is an exploded perspective view of the semiconductor device 210. However, to facilitate understanding, molding resin and the solder layers 78 in the semiconductor device 210 are omitted. The semiconductor device 210 of the present example has a semiconductor chip 50-1 that is an IGBT chip and a semiconductor chip 50-2 that is a FWD chip, which are provided and arranged in the Y axis direction. The lower surfaces of the semiconductor chips 50-1 and 50-2 are both electrically connected to the second region 84 of the lead frame 80. Also, the upper surfaces of the semiconductor chips 50-1 and 50-2 are both electrically connected to the second region 94 of the lead frame 90 via the conductive spacer 76 etc.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

It should be noted that the operations, procedures, steps, and stages of each process performed by a device, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising a housing, wherein the housing has:
   a first surface;
   a concave portion provided to the first surface;
   a second surface to face toward the first surface; and
   a convex portion provided in contact with the second surface, wherein
   in a thickness direction of the housing directed from the first surface to the second surface, the concave portion and the convex portion are provided at positions corresponding to each other;
   an end of the concave portion is formed of a same resin material as that of the first surface; and
   the convex portion is formed of a resin material or glass.

2. The semiconductor device according to claim 1, wherein a second length of the convex portion from the second surface to an end of the convex portion in the thickness direction is greater than a first length of the concave portion from the first surface to an end of the concave portion opposite from the first surface in the thickness direction.

3. The semiconductor device according to claim 1, wherein the housing has identification information provided to at least one of the first surface and the second surface.

4. The semiconductor device according to claim 1, further including a heat dissipation member externally exposed on the first surface or the second surface, wherein
   the heat dissipation member is electrically insulated from a semiconductor chip.

5. The semiconductor device according to claim 4, wherein a second length of the convex portion from the second surface to an end of the convex portion in the thickness direction is greater than a length obtained by adding a protruding length of the heat dissipation member protruding from the first surface or the second surface and a first length of the concave portion from the first surface to an end of the concave portion opposite from the first surface in the thickness direction.

6. The semiconductor device according to claim 4, wherein the heat dissipation member has identification information provided to an end surface of the heat dissipation member, the end surface being externally exposed, instead of identification information provided to the first surface or the second surface on which the heat dissipation member is externally exposed.

7. The semiconductor device according to claim 4, further comprising an external connection terminal protruding from the second surface, wherein difference between a second length of the convex portion from the second surface to an end of the convex portion in the thickness direction and a protruding length from the second surface to an end of the external connection terminal opposite from the second surface in the thickness direction is greater than a first length of the concave portion from the first surface to an end of the concave portion opposite from the first surface in the thickness direction.

8. The semiconductor device according to claim 4, wherein
   the first surface is generally rectangular;
   at least one additional concave portion is provided to the first surface;
   at least one additional convex portion is provided in contact with the second surface;
   in the thickness direction of the housing directed from the first surface to the second surface, the at least one additional concave portion and the at least one additional convex portion are provided at positions corresponding to each other;
   the convex portion is provided in a first corner of the generally rectangular first surface and the at least one additional convex portion is provided in a second corner of the generally rectangular first surface diagonal to the first corner; and
   a third corner and a fourth corner of the generally rectangular first surface different from the first corner and the second corner do not include a convex portion.

9. The semiconductor device according to claim 1, wherein the housing has:
   three concave portions, each being the concave portion, not all of which are provided on a single straight line; and
   three convex portions, each being the convex portion, not all of which are provided on a single straight line.

10. The semiconductor device according to claim 9, wherein:
    The three concave portions have shapes different from each other in the first surface as seen in a direction parallel with the thickness direction;
    The three convex portions have shapes different from each other in the second surface as seen in a direction parallel with the thickness direction; and
    when a plurality of housings, each being the housing, is made to overlap each other in the thickness direction, the three convex portions have shapes to fit the three concave portions provided at corresponding positions in the thickness direction.

11. The semiconductor device according to claim 1 wherein:
    outer outlines of the first surface and the second surface are in rectangular shapes in the housing as seen in a direction parallel with the thickness direction; and
    the housing has:
      four concave portions, each being the concave portion, respectively provided at corners of the first surface; and
      four convex portions, each being the convex portion, respectively provided at corners of the second surface.

12. The semiconductor device according to claim 1, wherein
    the first surface and the second surface are in rectangular shapes; and
    the housing has:
      two concave portions, each being the concave portion, provided extending along two opposing sides of the first surface respectively; and two convex portions, each being the convex portion, provided extending along two opposing sides of the second surface respectively.

13. The semiconductor device according to claim 12, wherein the housing has:
   three concave portions, each being the concave portion, provided extending along three sides of the first surface respectively; and
   three convex portions, each being the convex portion, provided extending along three sides of the second surface respectively.

14. The semiconductor device according to claim 13, wherein the housing has:
   four concave portions, each being the concave portion, provided extending along four sides of the first surface respectively; and
   four convex portions, each being the convex portion, provided extending along four sides of the second surface respectively.

15. The semiconductor device according to claim 14, wherein the housing has:
   the concave portion annularly provided on the first surface; and
   the convex portion annularly provided on the second surface.

16. The semiconductor device according to claim 1, wherein
   the housing includes:
      a frame member; and
      a resin sealing member provided inside the frame member as the frame member is seen in the thickness direction,
   surfaces of the resin sealing member constitute parts of the first surface and the second surface, and
   the frame member is provided with the concave portion and the convex portion.

17. The semiconductor device according to claim 1, wherein
   the housing includes:
      a frame member; and
      a resin sealing member provided inside the frame member as the frame member is seen in the thickness direction,
   the first surface and the second surface are surfaces of the resin sealing member, and
   the resin sealing member is provided with the concave portion and the convex portion.

18. The semiconductor device according to claim 1, wherein:
   in the housing, the first surface, the second surface, and a side surface positioned between the first surface and the second surface in the thickness direction are formed of a same resin material respectively; and
   the semiconductor device includes a heat dissipation member externally exposed on the first surface or the second surface.

19. A semiconductor device comprising
   a housing, and
   a heat dissipation member, wherein:
   the housing has a first surface, and a second surface to face toward the first surface, each of the first surface and the second surface being a surface of a resin member respectively;
   the heat dissipation member is externally exposed from the housing on the first surface;
   the housing has a convex portion provided in contact with the second surface;
   the heat dissipation member has a concave portion provided to an end surface of the heat dissipation member;
   in a thickness direction of the housing directed from the first surface to the second surface, a position of the concave portion of the heat dissipation member corresponds to a position of the convex portion of the housing;
   an end of the concave portion is formed of a same resin material as that of the first surface; and
   the convex portion is formed of a resin material or glass.

20. A semiconductor device comprising
   a housing, and
   a heat dissipation member, wherein:
   the housing has a first surface, and a second surface to face toward the first surface, each of the first surface and the second surface being a surface of a resin member respectively;
   the heat dissipation member is externally exposed from the housing on the first surface;
   the housing has a concave portion provided in contact with the second surface;
   the heat dissipation member has a convex portion provided to an end surface of the heat dissipation member;
   in a thickness direction of the housing directed from the first surface to the second surface, a position of the convex portion of the heat dissipation member corresponds to a position of the concave portion of the housing;
   an end of the concave portion is formed of a same resin material as that of the first surface; and
   the convex portion is formed of a resin material or glass.

* * * * *